(12) United States Patent
Franceschini et al.

(10) Patent No.: US 8,413,004 B2
(45) Date of Patent: Apr. 2, 2013

(54) LENGTHENING LIFE OF A LIMITED LIFE MEMORY

(75) Inventors: Michele Franceschini, White Plains, NY (US); John Peter Karidis, Ossining, NY (US); Luis A. Lastras-Montano, Cortlandt Manor, NY (US); Thomas Mittelholzer, Zurich (CH); Mark N. Wegman, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/408,407

(22) Filed: Feb. 29, 2012

(65) Prior Publication Data

US 2012/0192034 A1 Jul. 26, 2012

Related U.S. Application Data

(62) Division of application No. 12/391,547, filed on Feb. 24, 2009.

(51) Int. Cl.
| | |
|---|---|
| *G08C 25/02* | (2006.01) |
| *H04L 1/18* | (2006.01) |
| *H04H 40/00* | (2008.01) |
| *H04W 4/00* | (2009.01) |
| *H04W 24/00* | (2009.01) |
| *H04B 7/00* | (2006.01) |
| *G11C 11/34* | (2006.01) |
| *G11C 16/04* | (2006.01) |
| *G06M 3/00* | (2006.01) |

(52) U.S. Cl. ........ 714/748; 370/336; 370/280; 370/294; 370/321; 455/3.06; 455/422.1; 455/456.6; 455/524; 365/185.33; 377/26

(58) Field of Classification Search ................... 714/748, 714/763, 760, 768; 711/103, 173, 154; 326/39; 365/185.29, 185.33, 189.011
See application file for complete search history.

(56) References Cited

U.S. PATENT DOCUMENTS

| | | | |
|---|---|---|---|
| 7,372,725 B2 | 5/2008 | Philipp et al. | |
| 2009/0080249 A1 | 3/2009 | Sprouse et al. | |
| 2010/0262890 A1* | 10/2010 | Radke | 714/763 |
| 2011/0176358 A1* | 7/2011 | Parkinson et al. | 365/163 |
| 2011/0286267 A1 | 11/2011 | Rychlik et al. | |

FOREIGN PATENT DOCUMENTS

WO  WO 2007/132452 A2  11/2007

OTHER PUBLICATIONS

Rivest et al., How to Reuse a Write-once Memory, Inform. and Control, vol. 55, pp. 1-19, 1982.

(Continued)

*Primary Examiner* — Guerrier Merant
(74) *Attorney, Agent, or Firm* — Brian Verminski; Ryan, Mason & Lewis, LLP

(57) ABSTRACT

A phase-change memory (PCM) includes a matrix of storage cells, including at least a first group with at least one cell. Each cell includes a phase change material having at least a first resistance value and a second resistance value, such that the first group can have an identical message encoded therein in at least a first way and a second way. The memory also includes a controller configured to encode the identical message in the at least first group the first or second way, based on which way causes the least amount of writing cost, given current levels of the group. Another embodiment of memory includes a matrix of storage cells. Each of the storage cells has at least two levels, such that each of the storage cells can have an identical message encoded therein in at least a first way and a second way.

12 Claims, 18 Drawing Sheets

OTHER PUBLICATIONS

Heegard et al., On the Capacity of Computer Memory with Defects, IEEE Trans. Inform. Theory, vol. 29, No. 5, pp. 731-739, Sep. 1983.

Fiat et al., Generalized "write-once" Memories, IEEE Transactions on Information Theory, vol. 30, pp. 470-480, May 1984.

Heegard, On the Capacity of Permanent Memory, IEEE Transactions on Information Theory, vol. 31, pp. 34-42, Jan. 1985.

Kuznetsov et al., On the General Defective Channel with Informed Encoder and Capacities of Some Constrained Memories, IEEE Tran. Inform. Theory, vol. 40, No. 6, pp. 1866-1871, Nov. 1994.

Simonyi, On Write-Unidirectional Memory Codes, IEEE Trans. Inform. Theory, vol. 35, No. 3, pp. 663-667, May 1989.

Fu et al., On the Capacity of Generalized Write-Once Memory with Issue State Transitions Described by an Arbitrary Directed Acyclic Graph, IEEE Transactions on Information Theory, vol. 45, No. 1, pp. 308-313, Jan. 1999.

Ahlswede et al., Coding for Write-Efficient Memory, Inform. and Comput., vol. 83, No. 1, pp. 80-97, 1989.

Nirsch et al., Write Strategies for 2 and 4-bit Multi-Level Phase-Change Memory, IEEE International Electron Devices Meeting, 2007. IEDM 2007., pp. 461-464, 2007.

D.H.K. et al., Two-bit Cell Operation in Diode-Switch Phase Change Memory Cells with 90nm Technology, in Proc. VLSI'08, Hyderabad, Jan. 4-8, 2008.

Bedeschi et al., A Multi-Level-Cell Bipolar-Selected Phase-Change Memory, Solid-State Circuits Conference, 2008. ISSCC 2008. Digest of Technical Papers. IEEE International, pp. 428-625, 2008.

Jiang et al., Floating Codes for Joint Information Storage in Write Asymmetric Memories, in 2007 IEEE International Symposium on Inform. Theory, Jun. 2007, pp. 1166-1170.

Bohossian et al., Buffer Coding for Asymmetric Multi-Level Memory, in 2007 IEEE International Symposium on Inform Theory, 2007, pp. 1186-1190.

Justesen et al., Maxentropic Markov Chains, IEEE Transactions on Information Theory, vol. 30, pp. 665-667, Jul. 1984.

Fu et al., On the Capacity and Error Correcting Codes for Write Efficient Memories, IEEE Transactions on Information Theory, vol. 46, No. 7, pp. 2299-2314, Nov. 2000.

Raoux et al., Phase-change Random Access Memory: A Scalable Technology, IBM Journal Research and Development, vol. 52, pp. 465-480, 2008.

Yaakobi et al., An Information Theory Approach for Flash Memory, FLASH Memory Summit, Aug. 2008.

Kuznetsov et al., Coding in a Memory with Defective Cells, Problemy Peredachi Informatsii, vol. 10, No. 2, pp. 52-60, Apr.-Jun. 1974.

Lee et al., A Novel Programming Method to Refresh a Long-Cycled Phase Change Memory Cell, 2008 IEEE, pp. 46-48.

Yaakobi et al., An Information Theory Approach for Flash Memory, Santa Clara, CA USA, Aug. 2008, pp. 1-16.

* cited by examiner

FIG. 3
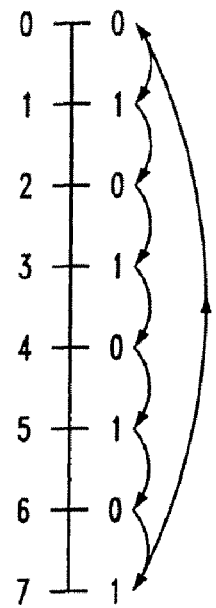
FIG. 4
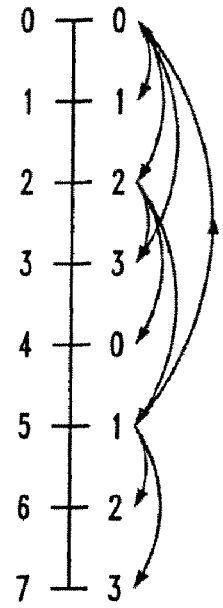
FIG. 5

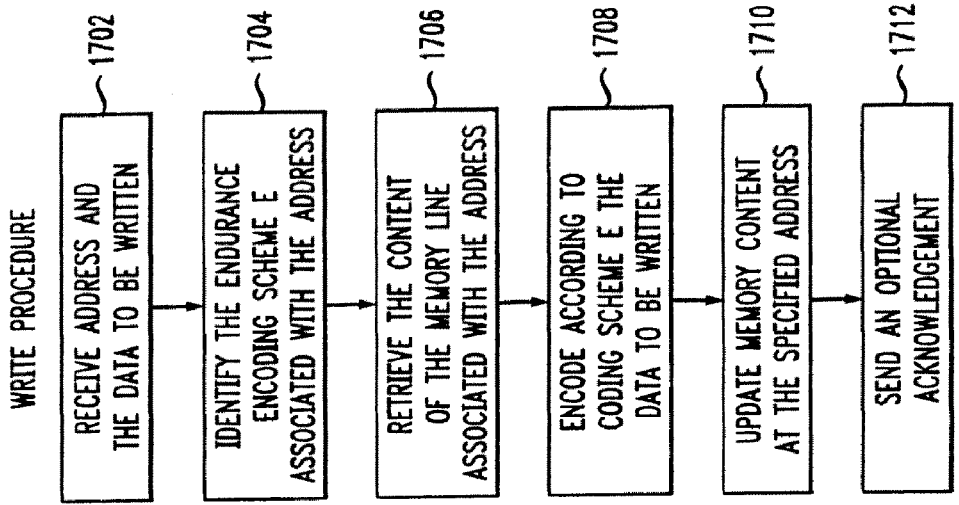
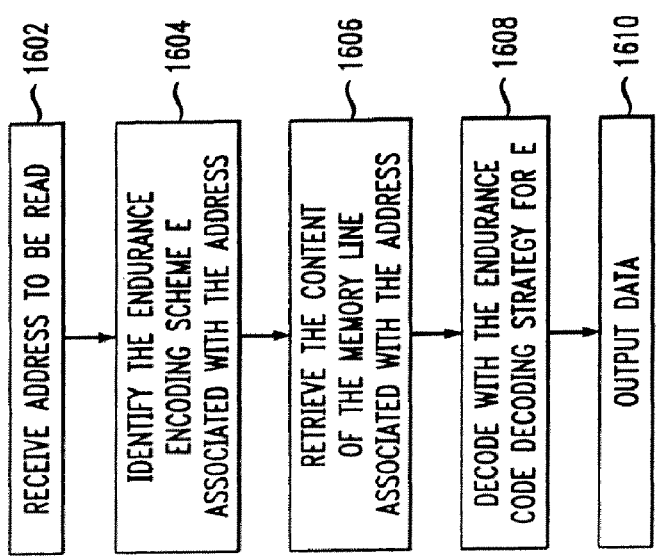

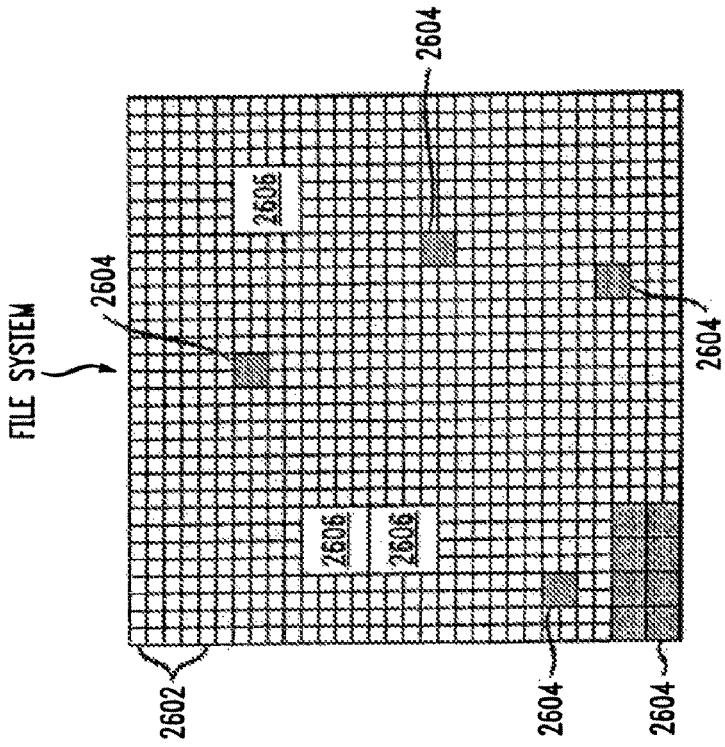

US 8,413,004 B2

LENGTHENING LIFE OF A LIMITED LIFE MEMORY

CROSS-REFERENCE TO RELATED APPLICATIONS

This application is a divisional of U.S. patent application Ser. No. 12/391,547, filed Feb. 24, 2009, incorporated by reference herein.

FIELD OF THE INVENTION

The present invention relates to the electrical, electronic and computer arts, and, more particularly, to memory circuitry and the like.

BACKGROUND OF THE INVENTION

Several memory technologies are emerging, which are characterized by a limited lifetime, i.e., each memory location can be written a limited number of times, due to a wearing process that eventually leads to a malfunctioning memory location. One non-limiting example of such a memory technology is phase change memory (PCM). A phase-change material is one that exists in at least two stable phases with markedly different resistivity properties and that can be repeatedly cycled between these phases. In at least some such materials, the amorphous phase is characterized by a high electrical resistivity, while the crystalline phase (or phases) exhibit low resistivity. The change in resistivity can be as large as five orders of magnitude (a 10,000,000% difference).

SUMMARY OF THE INVENTION

Principles of the invention provide techniques for lengthening life of a limited life memory, as well as techniques for memory systems with enhanced lifetime regions.

In one aspect, an exemplary embodiment of a phase-change memory includes a matrix of storage cells. The matrix includes at least a first group, comprising at least one of the storage cells. Each of the storage cells includes a phase change material having at least a first resistance value and a second resistance value, such that the first group can have an identical message encoded therein in at least a first way and a second way. The memory also includes a controller that is electrically coupled to the matrix, and that is configured to encode the identical message in the at least first group using one of the at least first and second ways, based on which of the at least first and second ways causes the least amount of writing cost to the group when writing the message into the group, taking into account current levels of the resistance values of the group.

In another aspect, an exemplary embodiment of a memory includes a matrix of storage cells, comprising at least a first group. The at least first group includes at least one of the storage cells, and each of the storage cells has at least two levels, such that each of the storage cells can have an identical message encoded therein in at least a first way and a second way. Each of the storage cells is arbitrarily individually changeable among the at least two levels, and each of the cells is asymmetric such that increasing from one of the at least two levels to another of the at least two levels has a different cost than decreasing from the another of the at least two levels to the one of the at least two levels. The memory also includes a controller that is electrically coupled to the matrix, and that is configured to encode the identical message in the at least first group using one of the first way and the second way, based on which of the first way and the second way incurs a least cost when writing the message into the at least one cell of the at least first group, taking into account current values of the levels of the at least first group.

In still another aspect, an exemplary embodiment of a memory system includes an assembly of memory cells comprising at least a first section and a second section. At least the memory cells in the first section are of a kind which degrade with use. The first section of the memory cells are encoded, according to a first endurance coding scheme, to reduce the degradation with use. The second section of the memory cells are not encoded according to the first endurance coding scheme. Also included in the memory system is a controlling module electrically coupled to the assembly. The controlling module is configured to write first data, requiring frequent writing and/or high reliability, to the first section, and also to write second data, not requiring frequent writing and/or high reliability (as compared to the first section), to the second section.

In yet another aspect, an exemplary embodiment of a memory system includes a matrix of memory cells organized as a plurality of memory lines. Each of the lines includes a payload portion and a metadata portion. The metadata portion requires more frequent updating and/or higher reliability than the payload portion. At least those of the memory cells associated with the metadata portions are of a kind which degrade with use. The memory cells associated with the metadata portions are encoded according to a first endurance coding scheme, to reduce the degradation with the use and thereby withstand more frequent updating and/or achieve higher reliability. Those of the memory cells associated with the payload portions are not encoded according to the first endurance coding scheme. Also included is a controller electrically coupled to the matrix.

In a further aspect, an exemplary file system includes an assembly of memory blocks comprising a first region and a second region. The memory blocks are of a kind which degrade with use. The first region of the memory blocks is encoded, according to a first endurance coding scheme, to reduce the degradation with the use. The second region of the memory blocks is not encoded according to the first endurance coding scheme. The first region has quickly mutable data and/or data requiring high reliability, stored therein as compared to the second region. Also included is a controller electrically coupled to the assembly. The controller is configured to interface between the assembly and an external user and to dynamically reconfigure the blocks among the regions.

In a still further aspect, an exemplary method includes reading current contents of a counter, stored in a non-volatile memory. The counter is endurance coded according to an endurance code. Further steps include decoding the current contents using the endurance decoder to obtain a decoded current contents value; and adding a desired number, having one of a positive and a negative number value, to the decoded current contents value, to obtain a result. The result can then be encoded, using the endurance code, to obtain an encoded result; and the encoded result can be stored in the nonvolatile memory as the new value of the counter. When it is merely desired to read the counter value, the first two steps can be performed.

In some embodiments, elements of the invention, such as controlling modules, controllers, and the like, can be implemented in the form of a computer product including a tangible computer readable recordable storage medium with computer usable program code for performing the method steps indicated. Furthermore, such elements of the invention can, in some cases, be implemented in the form of an apparatus including a memory and at least one processor that is coupled to the memory and operative to perform the method steps indicated. Yet further, in another aspect, such elements of the invention can, in some cases, be implemented in the form means for carrying out one or more of the method steps described herein; the means can include (i) hardware module(s), (ii) software (for example, firmware) module(s), or (iii) a combination of hardware and software modules; any of (i)-(iii) implement the specific techniques set forth herein, and the software modules are stored in a tangible computer-readable storage medium (or multiple such media).

These and other features, aspects and advantages of the present invention will become apparent from the following detailed description of illustrative embodiments thereof, which is to be read in connection with the accompanying drawings.

BRIEF DESCRIPTION OF THE DRAWINGS

FIG. 3 shows a first exemplary waterfall code for a cell with 8 levels, according to an aspect of the invention;

FIG. 4 shows a second exemplary waterfall code for a cell with 8 levels, according to another aspect of the invention;

FIG. 5 shows an illustrative code construction, according to still another aspect of the invention;

FIGS. 16-18 present flow charts and a block diagram for exemplary unified memory control, according to additional aspects of the invention;

FIG. 26 shows an exemplary storage system according to an added aspect of the invention;

FIG. 27 shows an exemplary file system organization for the exemplary memory of FIG. 26;

DETAILED DESCRIPTION OF PREFERRED EMBODIMENTS

Aspects of the invention address memories capable of storing multiple bits per memory cell, of the type where certain state transitions cause the cell to wear or degrade. Certain embodiments of the invention are especially advantageous for Phase Change Memory, a promising emerging nonvolatile memory technology that exhibits limitations in the number of particular write actions that one may apply to a cell before rendering it unusable. Techniques using the theory of Write Efficient Memories are employed in one or more instances, wherein a closed form expression for the storage capacity/lifetime tradeoff is provided. Furthermore, additional aspects of the invention include exemplary embodiments of families of codes specialized to distinct ranges for the target lifetimes, covering the full range from moderate redundancy to an arbitrarily large lifetime increase. One or more of these exemplary codes advantageously exhibit low implementation complexity and good performance. In a non-limiting example, in an 8 level cell, techniques according to one or more embodiments of the invention increase the lifetime of a memory by a factor of ten while sacrificing only ⅔ of the uncoded storage capacity of the memory.

Write Once Memories, i.e., memories in which transitions from "0" to "1" are not allowed, can in fact be reused to some degree.

If a cost is associated to transitions instead of disallowing some of them altogether, then a different model arises. Ahlswede and Zhang coined the term Write Efficient Memories (WEM) to refer to to them. R. Ahlswede and Z. Zhang, Coding for write-efficient memory. *Inform. and Comput.*, vol. 83, no. 1, pp. 80-97, 1989 ("Ahlswede"). One ormmore embodiments of the invention provide a WEM model that is particularly well suited to the properties of Phase Change Memory (PCM).

Figure 1:
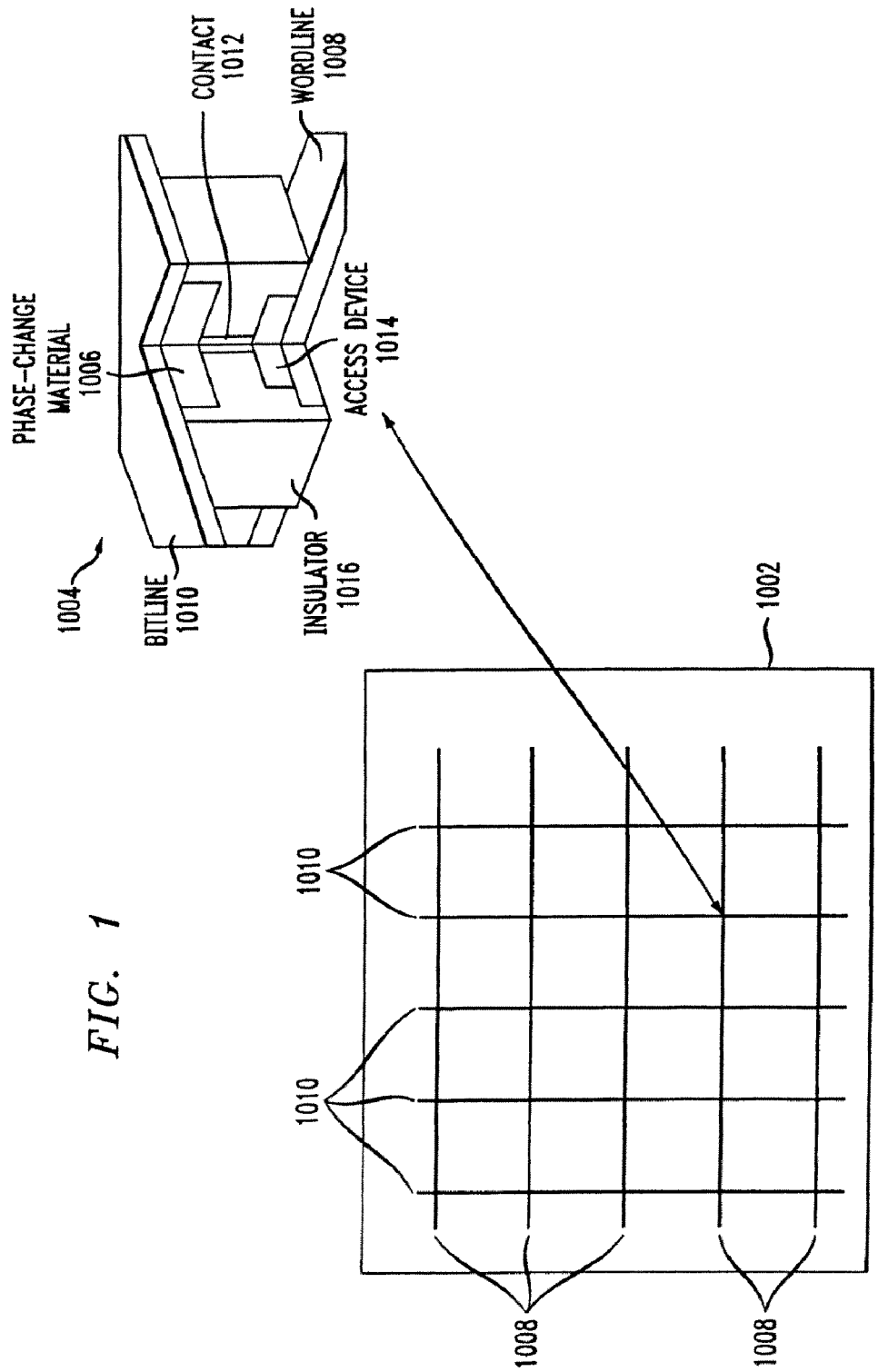
FIG. 1 shows an exemplary phase change memory, exemplary of types of memory with which one or more aspects of the invention can be employed.

FIG. 1 shows a phase-change memory with a matrix 1002 of cells such as cells 1004. Each of the cells 1004 includes a phase change material 1006 as described. Typically, a controller electrically coupled to the matrix 1002 is also included, as will be discussed below; the same is omitted from FIG. 1 for brevity. A plurality of word lines 1008 and bit lines 1010 can be provided, with the cells 1004 located at the intersections thereof. Note also contact 1012, access device 1014, and insulator 1016. The cell 1004 is exemplary of various types of PCM cells that can be employed with those embodiments of the invention directed to PCM.

PCM promises faster read and write times than the ubiquitous FLASH memory technology and does not require cells need to be erased in large blocks. Rather, PCM allows single cell erase actions. Both FLASH and PCM have a limitation in how many times they can be written and then erased. Current single bit/cell FLASH typically allows for 10 write-erase cycles; this is projected to diminish even further as the lithography evolves to finer dimensions. Even though PCM's corresponding statistic appears to be in the $10^8$ write-erase cycles range, there are many potential applications for PCM that can require a larger lifetime.

In PCM, memory cells store information in a material that can exist in two stable phases, amorphous or crystalline, which have markedly different resistivity properties. By a proper control of the input signals of these memories, PCM memory cells can attain intermediate resistance values, such that it is possible to store multiple bits per memory cell. It is possible to reduce the resistance of a cell gradually, through an annealing process; however, increasing the resistance requires a "RESET" operation which necessitates melting of material. For purposes of illustration, assume that RESET operations are the major factor accounting for the limited lifetime of the memory. Advantageously, in one or more embodiments, PCM memory cells are not required to be reset concurrently as a block. Accordingly, one or more illustrative techniques, according to aspects of the invention, model PCM as a multilevel WEM in which changing levels in a given direction (reducing resistance) does not cost while changing levels in the opposite direction (which requires a RESET) has a cost. As used herein, this aspect is referred to as a multilevel asymmetric WEM.

In current FLASH technology, the reset operation is performed on large memory blocks. It should be noted that one or more prior art models are based on the Write Once Memory (WOM) theoretical framework rather than the WEM model, according to embodiments of the invention, which advantageously provides an appropriate model for PCM. Aspects of the invention address tradeoffs between the storage capacity and lifetime of Multilevel Asymmetric Write Efficient Memories; by employing a transition cost model tailored to PCM closed form expressions detailing the relation between storage capacity and lifetime are obtained. Beneficially, one or more embodiments of the invention provide several families of codes that span the entire range of lifetime and code rates for arbitrary numbers of levels. In spite of their relatively small block lengths, these codes operate close to the fundamental limits.

Information Theoretic Model

A significant aspect, in one or more embodiments, is that of the storage capacity of a Write Efficient Memory with a transition cost constraint. For illustrative purposes, assume a model in which each memory cell can take on N values and where the cost of a transition from value $j\in\chi=\{0,1,\ldots,N-1\}$ to value $i\in\chi$ is $\kappa(i|j)$. In order to improve the lifetime of the memory, a coding technique is used as follows. Let $n_c$ denote the number of cells in a codeword, so that a physical codeword is denoted by an $n_c$ vector with entries in $\chi=\{0,\ldots,N-1\}$. The total number of messages that can be described with a code is denoted by M. The number of bits stored per cell with this notation is given by $n_c^{-1}\log M$. Each physical codeword is associated with a label via a labeling function:

$$l: \chi^{n_c} \to \{0,\ldots,M-1\} \qquad (1)$$

A code is specified by giving a labeling function used to decode and a transition function used to encode. The transition function is given by:

$$\sigma: \chi^{n_c} \times \{0,\ldots,M-1\} \to \chi^{n_c} \qquad (2)$$

which specifies what physical message to imprint in a memory as a function of the existing stored physical pattern and the new information message that it is desired to encode. The act of imprinting the memory when the message is in incurs a normalized cost:

$$\frac{1}{n_c}\sum_{i=1}^{n_c}\kappa(\sigma(x^{n_c},m)_i \mid x_i) \qquad (3)$$

where $x^{n_c}\in\chi^{n_c}$ and the subscript notation is used to indicate a particular element of the vector. The capacity of the Write Efficient Memory with a cost constraint $\xi$ is the maximal asymptotic rate $R=n_c^{-1}\log M$ (as $n_c$ grows) that one can obtain while using a code whose normalized cost, given by (3), is no greater than $\xi$.

In accordance with Ahlswede, the storage capacity of the WEM, subject to a cost $\xi$, is given by the single letter expression:

$$C(\xi) = \max_{P_{X,Y}: P_X = P_Y, E[\kappa(Y|X)] \leq \xi} H(Y \mid X), \qquad (4)$$

where X and Y are random variables representing old and new physical contents of a memory cell, respectively, and $E[\cdot]$ denotes the expectation operator. These random variables take values on $\{0,\ldots,N-1\}$ and have a joint probability mass function Theoretical Limits For illustrative purposes, focus on the cost matrix given by $$\kappa(k|j) = I(k<j), \qquad (5)$$

where $I(\cdot)$ is one, if the argument is true, and is otherwise zero. Thus, transitioning a memory cell to a lower value has a cost of "one" whereas every other transition, including staying in the same value, has a cost of "zero." Here, lower values are associated with higher PCM cell resistance, and vice versa. In a particular method for writing PCM, pertinent to one or more embodiments of the invention, increasing the resistance requires a "RESET" operation. Accordingly, instead of referring to a "cost," in one or more illustrative embodiments, directly refer to $P_\uparrow$, which stands for the probability of increasing the resistance in PCM.

The optimal capacity/cost tradeoff for the cost matrix in can be calculated in closed form expression. By writing $P_{X,Y}=P_X Q_{Y|X}$, notes that it suffices to obtain the optimal conditional probability mass function $Q_{Y|X}$, since then computing its stationary distribution will result in $P_X$. This conditional probability, optimal for the cost in (5) is given by:

$$Q_{k|j} = \frac{(1-\alpha)}{(1-\alpha^N)}\alpha^{k-j\bmod N}. \qquad (6)$$

where $\alpha\in(0,1)$ is a parameter that arises from the Lagrange multiplier method used to solve (4). With this knowledge, the optimal tradeoff for the cost matrix (5) is given by $$R = \log\frac{1-\alpha^N}{1-\alpha} - \alpha\log(\alpha)\frac{1-N\alpha^{N-1}+(N-1)\alpha^N}{(1-\alpha)(1-\alpha^N)} \qquad (7),(8)$$

$$P_\uparrow = \frac{\alpha}{N} \frac{1 - N\alpha^{N-1} + (N-1)\alpha^N}{(1-\alpha)(1-\alpha^N)}.$$

Figure 2:
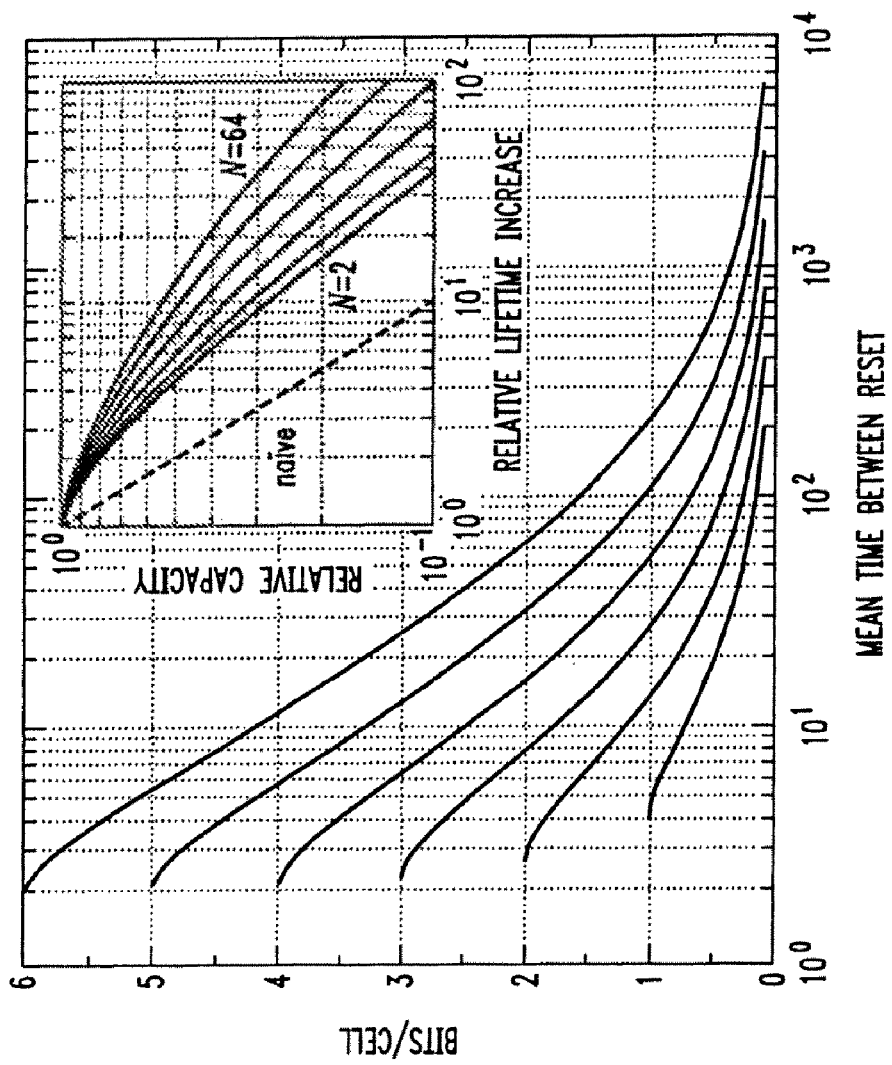
FIG. 2 shows a trade-off between storage capacity and memory lifetime for multilevel asymmetric write efficient memories.

To compute all tradeoff points, allow α to vary between 0 and 1. The conditional probability matrix is circulant, implying that the stationary distribution for this chain is uniform. It will be appreciated by the skilled artisan that good codes move the resistance of a cell downward according to a geometric probability mass function and then "wrap around" to a high resistance after reaching the lowest possible resistance. The bounds given by (7) and (8) are illustrated in FIG. 2, where the capacity is plotted as a function of $1/P_\uparrow$, the mean time between resets, considering 2, 4, 8, 16, 32 and 64 level cells. The inset figure depicts tradeoff curves wherein both axes are normalized so that the capacity loss required to increase the lifetime by a given factor can be read directly. Note that adding levels to a cell improves the lifetime increase, while holding the capacity loss constant. The inset of FIG. 2 also shows the performance of a naive coding technique. In this technique, if the information in a message to be written requires a number $n_i$ of cells, allocate $n_c > n_i$ cells. The $n_i$ cells that are being written and read from are periodically rotated over the $n_c$ available cells, thus tending to ensure even wear or degradation of the cells. Alternatively, whenever $1/P_\uparrow$ is an integer, the naive method corresponds to the "use-and-throw" approach of replacing the worn cells with new ones. After normalization, the naïve code curve for cells with differing levels is identical so that only one graph is shown.

Efficient Codes

Waterfall Codes

One or more embodiments of the invention employ a class of codes referred to as "Waterfall" codes. Consider a single cell with an even number of levels N, indexed as $\{0, 1, \ldots, N-1\}$. A one bit per cell code may be obtained by letting the even values correspond to a "zero" and the odd values correspond to a "one." When writing to the cell, if it is desired to switch the value of the information bit stored, all that is required is to increment the value by one. When the cell has physically stored the value N−1 and it is desired to transition to a "zero," reset the cell. Assuming that the bits being stored in the memory are independent, binary random variables with ½ chance of taking on 0 or 1, it will be appreciated that, for this code, $P_\uparrow = 1/(2N)$. The operation of two Waterfall codes is illustrated in FIGS. 3 and 4, considering one bit/cell (FIG. 3) and two bit/cell codes (FIG. 4) for an 8-level cell.

More generally, if M divides N, the scheme described above admits a straightforward extension, wherein the information value stored in a cell whose physical value is x is given by x mod M. Accordingly, the code stores logM bits per cell. If the current physical value of a cell is $x_{curr} \in \{0, 1, \ldots, N-1\}$ and it is desired to store an information value $I_{new} \in \{0, 1, \ldots, M-1\}$ to it, the rule for storing the information value $I_{new}$ in the memory is to find the smallest $\hat{x}_{new} \geq x_{curr}$ such that mod $M = I_{new}$, and then to set $x_{new} = \hat{x}_{new}$ modN.

If the information messages to be written in the memory cell are a sequence of independent random variables, each uniformly distributed in the set $\{0, \ldots M-1\}$, then the performance of the Waterfall codes can be summarized as follows: these are codes for a single cell with $$R = \log M \quad (9)$$

$$P_\uparrow = \frac{M-1}{2N} \quad (10)$$

where $M \geq 2$ divides $N \geq 2$. One significant aspect of these codes is that their performance is unexpectedly good considering the fact that they are single cell codes.

Figure 6:
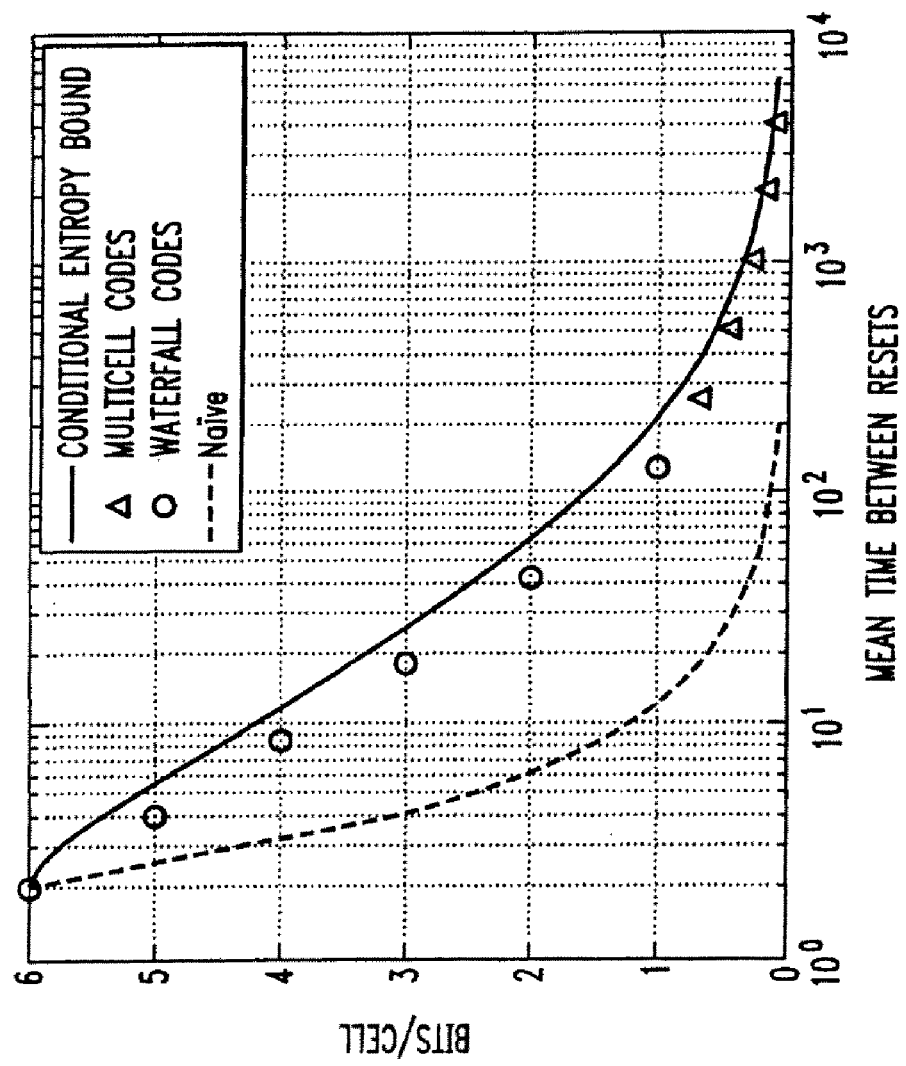
FIG. 6 illustrates exemplary performance of waterfall and multi-cell codes, for 64 levels.
Figure 7:
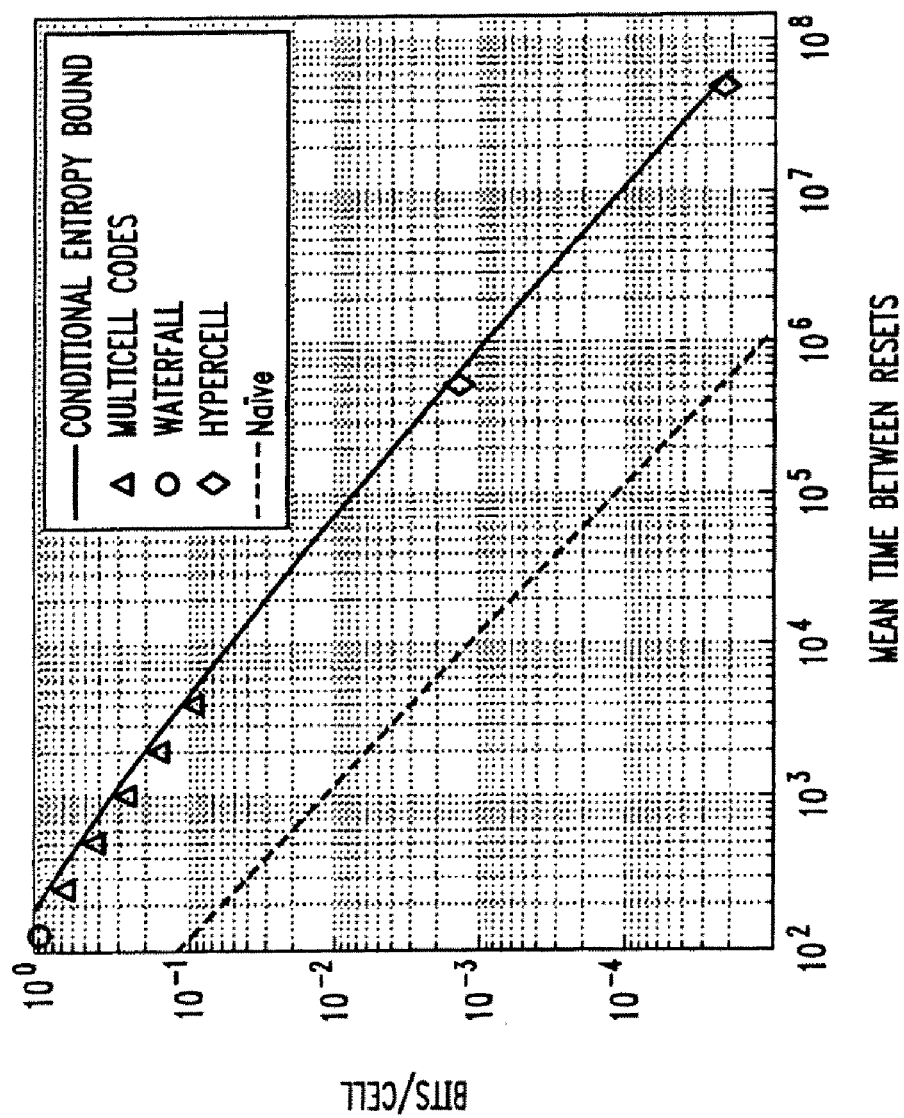
FIG. 7 illustrates exemplary performance of multi-cell and multi-hypercell codes, for 64 levels.

This is illustrated in FIG. 6, which compares the performance of all six Waterfall codes that exist for a 64 level cell.

Multicell Codes

While the Waterfall codes are quite advantageous for many applications, additional aspects of the invention provide a family of codes that operate below rates of one bit per cell. There exist as many codes of this type as Waterfall codes. The labeling function for these codes is given by $$\ell(x_0, x_1, \cdots, x_{n_c-1}) = \sum_{i=0}^{n_c-1} (i+1)x_i \bmod M. \quad (11)$$

Codes according to some embodiments of the invention have the restriction that $n_c = M-1$ and M divides N. The transition function is as follows. Assume a current label $I_{curr}$ and the desire to store a new distinct label $I_{new}$. Let δ be the unique integer in $\{1, \ldots, M-1\}$ such that $I_{new} = I_{curr} + \delta$ mod M; note that by construction, such δ must exist. Then set:

$$[x_{new}]_i = \begin{cases} [x_{curr}]_i & i \neq \delta - 1 \\ [x_{curr}]_i + 1 \bmod N & i = \delta - 1 \end{cases} \quad (12)$$

To illustrate that this transition function has the desired effect, note that if $[x_{curr}]_{\delta-1} = N-1$ then:

$$\ell(x_{new}) = \left(-\delta(N-1) + \sum_{i=0}^{n_c-1}(i+1)[x_{curr}]_i\right) \bmod M$$

$$\stackrel{(a)}{=} \delta + \ell_{curr} \bmod M \quad (13)$$

$$= \ell_{new}$$

where in (a), use the assumption that M divides N. To analyze $P_\uparrow$, note that $P(L_{curr} \neq L_{new}) = (M-1)/M$. By symmetry, $P(\Delta = i | L_{curr} \neq L_{new}) = 1/n_c$ and $P([X_{curr}]_i = N-1 | \Delta = i, L_{curr} \neq L_{new}) = 1/N$. Accordingly:

$$P_\uparrow = \frac{1}{n_c} P(L_{curr} \neq L_{new}, [X_{curr}]_\Delta = N-1)$$

$$= \frac{1}{n_c} \frac{M-1}{M} \frac{1}{N} \quad (14)$$

$$= \frac{1}{NM}$$

In summary, for this class of codes, in which $n_c = M-1$ cells, each with N levels:

$$R = \frac{\log M}{M-1} \quad (15)$$

-continued $$P_\uparrow = \frac{1}{NM} \quad (16)$$

where $M \geq 2$ divides $N \geq 2$.

A non-limiting illustrative example is now presented for $n_c=2, M=3, N=3$. In the diagram of FIG. 5, the integers denote the physical content of a cell (each of the two cells is assigned one of the dimensions). The symbols indicate the information message encoded in the two cells.

The transition rule is as follows: given a physical coordinate $(x_0, x_1)$ with $x_i \in \{0,1,2\}$, either stay, move down or to the right in the diagram, depending on the value of the new label that it is desired to reach. When making a movement causes a border crossing, "reset" the cell associated with the dimension in which the border is crossed.

Hypercells

The previous construction has the restriction that M needs to divide N. Since the average number of bits per cell for this class of codes decreases with M, for fixed N, which is generally a memory technology dependent parameter, further embodiments of the invention provide code constructions for even larger improvements in $P_\uparrow$.

In one or more embodiments, the codes above are extended with the notion of a hypercell. The idea is to group together H cells and treat them as a single cell (or, more accurately, as a hypercell). There are a total of $N^H$ levels, referred to herein as hyperlevels, that can be described with H cells. In order to interpret and change the values of the cells in a hypercell, some embodiments of the invention employ a particular flavor of N-ary Gray counters which will now be described.

Let $b_{H-2} \ldots b_1 b_0$ be an N-ary representation of an integer $b \in \{0, \ldots, N^H-1\}$. The N-ary Gray code $\hat{b}$ assigned to b is given by:

$\hat{b}_{H-1} \leftarrow b_{H-1}$ $$\hat{b}_i \leftarrow b_i - b_{i+1} \bmod N \; i \in \{0, \ldots, H-2\} \quad (17)$$

where the result of the mod operation is always a number in the set $\{0,1,\ldots,N-1\}$. As b varies between 0 and $N^H-1$, $\hat{b}$ takes values over all possible N-tuples with symbols in $\{0, \ldots, H-1\}$. Accordingly, the Gray code constitutes a bijective mapping. When the value of b is incremented by one:

Only one of the H symbols changes.

The symbol that changes always does so by increasing its value if it is not originally equal to N−1; otherwise it becomes 0.

The probability that a cell in the hypercell needs to be reset when incrementing the underlying Gray counter by one can be obtained as follows. The most significant symbol in the Gray code b changes value only when the most significant symbol in b changes. This happens in one out of the $N^H$ possible starting locations for the counter. Whenever the symbol $i \in \{0, \ldots, H-2\}$ is reset from N−1 to 0 in the Gray code, the corresponding transition in the standard arithmetic counter is of the form:

$$[*]_{H-2-i}[v+1][v][N-1]_i \to [*]_{H-2-i}[v+1][v+1][0]_i \quad (18)$$

where $v \in \{0, \ldots, N-2\}$, the notation [*] denotes any j symbols from $\{0, \ldots, N-1\}$ concatenated and $[s]_j$ denotes j symbols equal to s concatenated. Through a simple combinatorial argument, it can be determined that a total of $N^{H-1}$ of the $N^H$ possible patterns for the Gray counter result in exactly one cell being reset when the counter is incremented. This may be summarized as stating that the probability of a cell being reset in the hypercell when the counter is incremented is 1/N.

With regard to the above-mentioned Hypercell based codes, set $M=N^H$, the number of hyperlevels in the hypercell. Further, set $n_c=H(M-1)=H(N^H-1)$. To compute $P_\uparrow$ the same technique described above can be employed to obtain:

$$R = \frac{\log N}{N^H - 1}, \quad (19)$$

$$P_\uparrow = \frac{M-1}{M} \frac{1}{Nn_c} = \frac{1}{HN^{H+1}} \quad (20)$$

In one or more embodiments, the cells in a hypercell are degraded unevenly; for example, the least significant symbol gets reset more frequently than the other symbols. Some instances of the invention address this by rotating the position of the symbols in the counter periodically, thus giving the desired meaning to the $P_\uparrow$ computation above.

A non-limiting example of hypercell construction will now be presented. Let $N=3$, $H=2$, and thus $M=9$, $n_c=16$, $R=(\log 3)/8$, and $P_\uparrow=1/52$. The relation between the physical content of a hypercell and the associated counter value is given by:

| Counter value | 0 | 1 | 2 | 3 | 4 | 5 | 6 | 7 | 8 |
|---|---|---|---|---|---|---|---|---|---|
| Hypercell content | 00 | 01 | 02 | 12 | 10 | 11 | 21 | 22 | 20 |

Assume, for illustrative purposes, that the counters in the 8 hypercells are set to (2,2,0,0,0,0,0,3). Then the message, out of the 9 possible messages, being encoded in this pattern can be computed by:

$$(2 \times 1 + 2 \times 2 + 3 \times 8) \bmod 9 = 3 \quad (21)$$

If it is desired to change this message from 3 to 2, increment the value of the counter in the last hypercell, since $(2 \times 1 + 2 \times 2 + 4 \times 8) \bmod 9 = 2$. According to the Gray mapping, this requires changing the physical content of the 8th hypercell from 12 to 10, which means that the second cell in the hypercell needs to be reset.

figs/endurance2.eps Illustration of the performance of Multicell codes and Multi-hypercell codes for N=64 levels. Only two Multi-hypercell codes are illustrated in which the a hypercell is comprised of 2 or 3 regular 64 level cells. We include both the conditional entropy bound and the performance of the use-and-throw nave method.

Aspects of Efficient High-Rate Codes

Although the performance of Waterfall codes is, under certain circumstances, close to the theoretical limit, a gain of about 0.4 bits is still available in most cases, as can be observed in FIG. 6. On the other hand, the codes described in the subsections on multi-cell codes and hypercells exhibit a code rate smaller than (or equal to) 1, whereas Waterfall codes have code rate greater than (or equal to) 1. In some embodiments, generalize the labeling function in (11) as follows:

$$f(x_0, x_1, \cdots, x_{n_c-1}) = \sum_{i=0}^{n_c-1} v_i x_i \bmod M \quad (22)$$

where $v_i$ is a positive integer weight associated with the i-th coordinate. In order to raise the code rate, the restriction $n_c=M-1$ is also removed. If N is a multiple of M, the transition function is as follows: find a group (the base group) of M vectors:

$$(x_0^{(0)}, \ldots, x_{n_c-1}^{(0)}), \ldots, (x_0^{(M-1)}, \ldots, x_{n_c-1}^{(M-1)}) \quad (23)$$

whose labels are equal to 0, ... M−1, respectively and which minimizes:

$$\bar{\delta} = \sum_{i=0}^{n_c-1} \sum_{j=0}^{M-1} x_i^{(j)}. \quad (24)$$

Then, any label can be reached by adding one of the above vectors to the current x vector. The code rate and reset probability are, respectively:

$$R = \frac{\log M}{n_c}, \quad (25)$$

$$P_\uparrow = \frac{\bar{\delta}}{MNn_c}. \quad (26)$$

Figure 8:
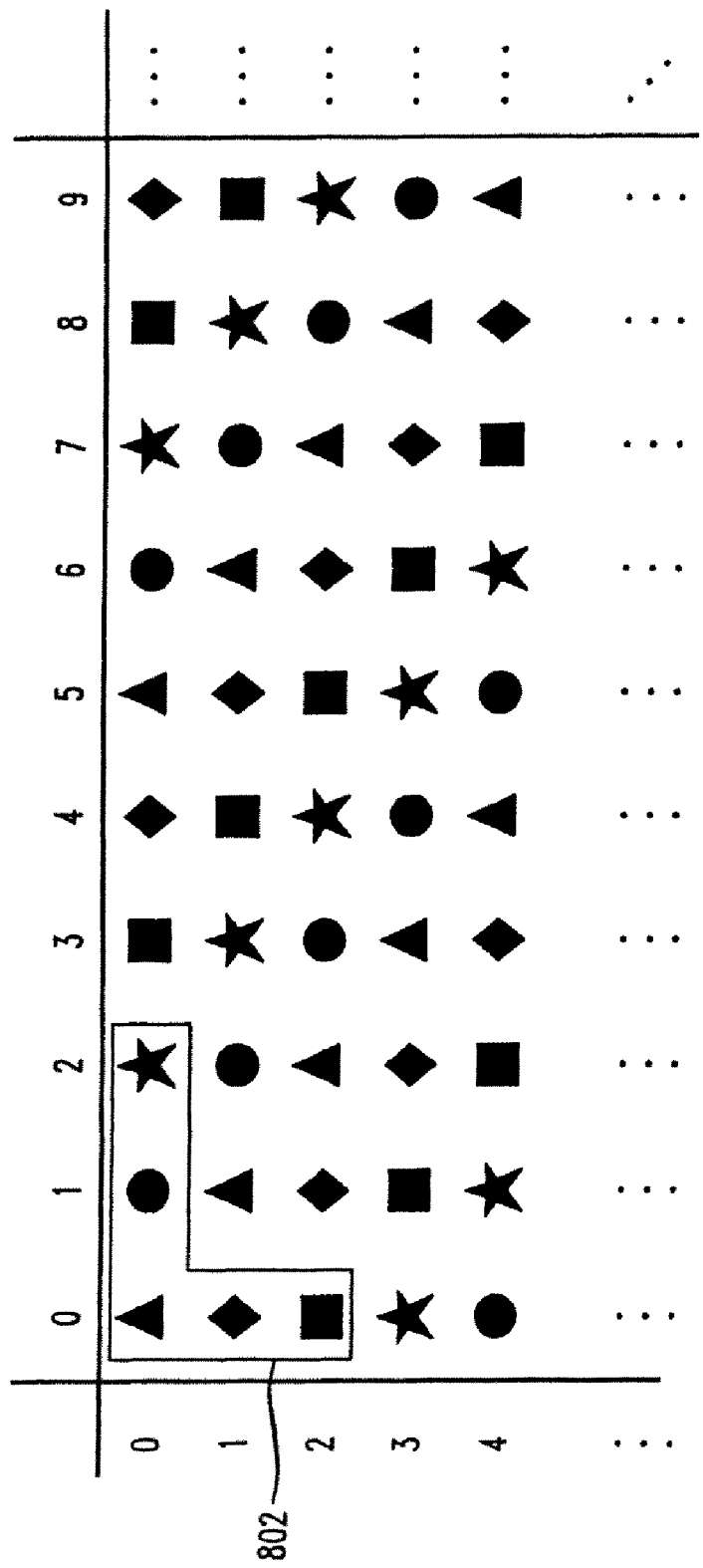
FIG. 8 shows co-sets for an exemplary code, according to yet another aspect of the invention.

As an example, consider the code with $n_c=2$, M=5, and N=10. Let $v_0=1$ and $v_1=-1$, i.e., $l(x_1,x_2)=x_1-x_2$ mod M. The cosets associated with each label are as shown in FIG. 8, where the base group has been highlighted at location 802. The code yields R=(log5)/2≅1.16, and $P_\uparrow$=3/50=0.06. For comparison, a time-sharing of two waterfall codes $n_c=2$, M=2, and N=10, and $n_c=2$, M=5, and N=10 with 14 out of 15 cells using the first one, yields the same probability of reset $P_\uparrow$=0.06 and rate R=(14+log5)/15≅1.088, i.e., a lower code rate. Note also that, unlike the above generalized code, the time-sharing code should preferably have periodic rotation of the cells, in order to obtain even degradation.

Aspects of the invention are thus pertinent to multilevel nonvolatile memories whose stored value can be modified in both directions with a significantly unbalanced cost in favor of a particular direction. One or more embodiments employ several exemplary categories of codes, covering a wide range of coding rates and lifetime improvement factors. The codes have good performance, significantly outperforming the common naive approach (using the memory without coding and replacing worn memory elements).

By way of recapitulation, several memory technologies are emerging, which are characterized by a limited lifetime, i.e., each memory location can be written a limited number of times, due to a wearing (degradation) process that eventually leads to a malfunctioning memory location. Additional aspects of the invention provide techniques to structure a memory or storage system that uses coding techniques for providing a memory or storage region whose lifetime is substantially longer than the lifetime guaranteed by the raw underlying memory technology. Embodiments of the invention can be applied to enable significant lifetime improvement for a storage device, by placing that file system data (files, file parts, or metadata) that is rewritten more often in the memory region having improved lifetime. Another non-limiting exemplary use is an embedded nonvolatile memory that provides one or more regions of nonvolatile memory with enhanced lifetime for applications that require frequent updating of contents of some portions of memory.

Endurance coding is a technique which allows a memory that has a limited number of writes to improve its lifetime (or equivalently, endurance) by trading off capacity for such increased endurance. Endurance coding techniques exist for both: (i) memories such as FLASH, which may only be written by transitioning the state of a cell in constrained ways (for example, only 1 to 0 transitions are allowed, unless an erasure operation is issued which affects a large block) and (ii) memories such as PCM, in which cells can be altered individually.

Endurance coding requires that a message be stored in more cells than would be required if no endurance coding was used. The amount of lifetime increase that endurance coding provides is flexible: in general, more lifetime can be obtained by increasing the number of bits required to store the message. A memory without endurance coding has a given target lifetime given by the "raw" number of cycles that are guaranteed by a memory manufacturer. A memory that is being utilized with endurance coding also has a target lifetime, which is dictated by both the raw capabilities of the memory as described above, as well as the endurance code that is being employed.

Figure 9:
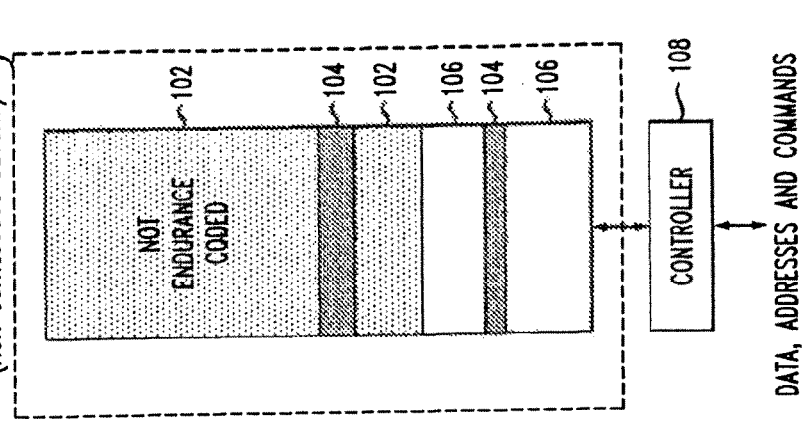
FIG. 9 shows an exemplary memory which is organized in three distinct sections, according to a further aspect of the invention.

Aspects of the invention provide a system and method in which a memory, broadly defined as a physical entity that can store data and from which data can also be read, has at least two sections with different target lifetimes, at least one of which is attained through endurance coding. FIG. 9 shows a memory 100 which is organized in three distinct sections, the first of which, 102, is not endurance coded (and hence its target lifetime is dictated by what a memory manufacturer promises), a second section 104 which is endurance coded with lifetime 11, and a third section 106, which is endurance coded with a lifetime 12. There is a controller 108 which provides access to this memory 100, whose functions depend on the intended use of the memory, and will be described on greater detail below.

Figure 10:
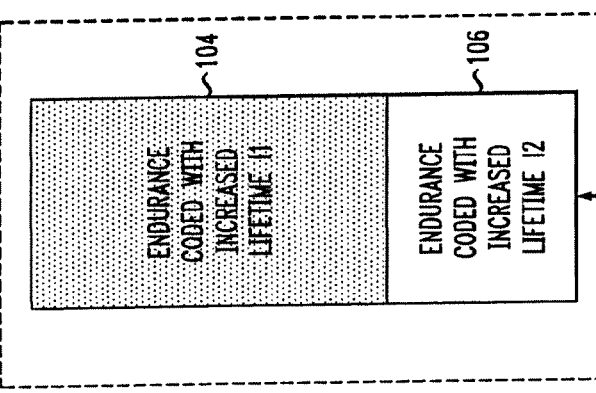
FIG. 10 shows an exemplary memory similar to that in FIG. 9, but wherein every region is endurance coded.
Figure 11:
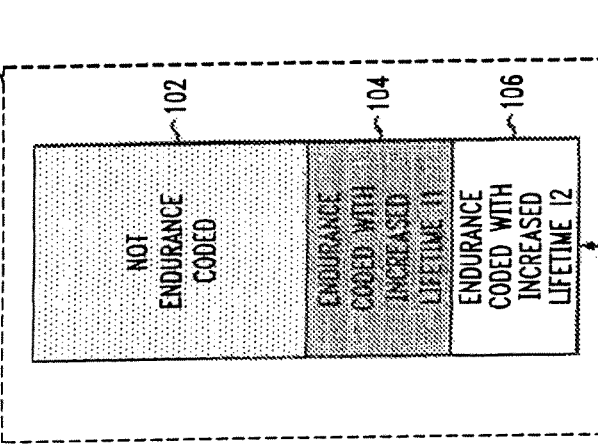
FIG. 11 illustrates that memory regions that are written and read to with an endurance code with a certain target lifetime need not be physically contiguous in the memory.

FIG. 10 shows another memory 110 in which every region is endurance coded. Elements similar to those in FIG. 9 have the same reference character. FIG. 11 shows yet another variant 112, in which it is made clear that memory regions that are written to and read from with an endurance code with a certain target lifetime need not be physically contiguous in the memory.

Figure 12:
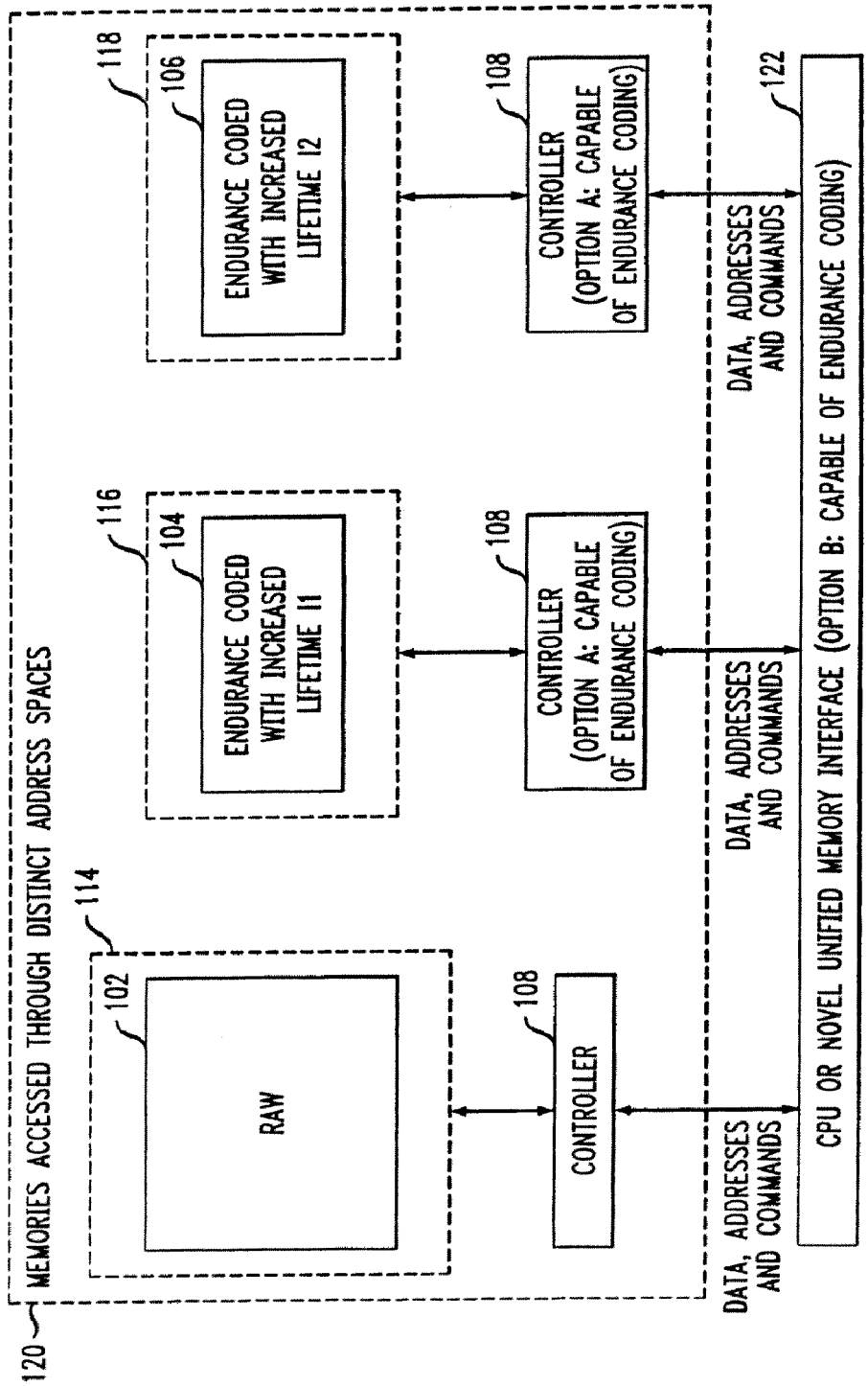
FIG. 12 shows an example of three memories with separate controllers placed together in a single entity, according to a still further aspect of the invention.

Another aspect of the invention is revealed in FIG. 12, in which three memories 114, 116, 118 with separate controllers 108 are placed together in a single entity 120 that is accessed either by a processing unit (labeled CPU) or by a unified memory interface, both of which are represented by block 122. The unified memory interface is configured to accessing the three memories 114, 116, 118. Note that FIG. 13 further discusses the embodiment in the case it is a CPU that is accessing the different memories.

In the case where block 122 is a unified memory interface that is connected to these distinct memories 114, 116, 118, the memory interface provides access to the differently endurance encoded memory regions 104 and 106, and, optionally, to a region 102 that is not endurance encoded. The different regions are accessed by issuing store and read commands to the unified memory controller 122; for example, by providing a different set of commands for every region, or by specifying the region to be accessed using a parameter to be passed as an argument of the store and read commands.

In a first option "A," the endurance coding is performed at the controller 108 that is associated with the memory, while the unified memory controller 122 serves as a common interface to all the memories 114, 116, 118. In a second option "B," the unified memory controller 122 performs all the operations needed for encoding and decoding using endurance codes. This means that, upon receiving a write command, block 122 retrieves the content of the memory line or page at the corresponding address (unless the content is already in the read buffer) and computes the update based on the content, the data to be written, and the particular region (which identifies the code to be used).

Figure 13:
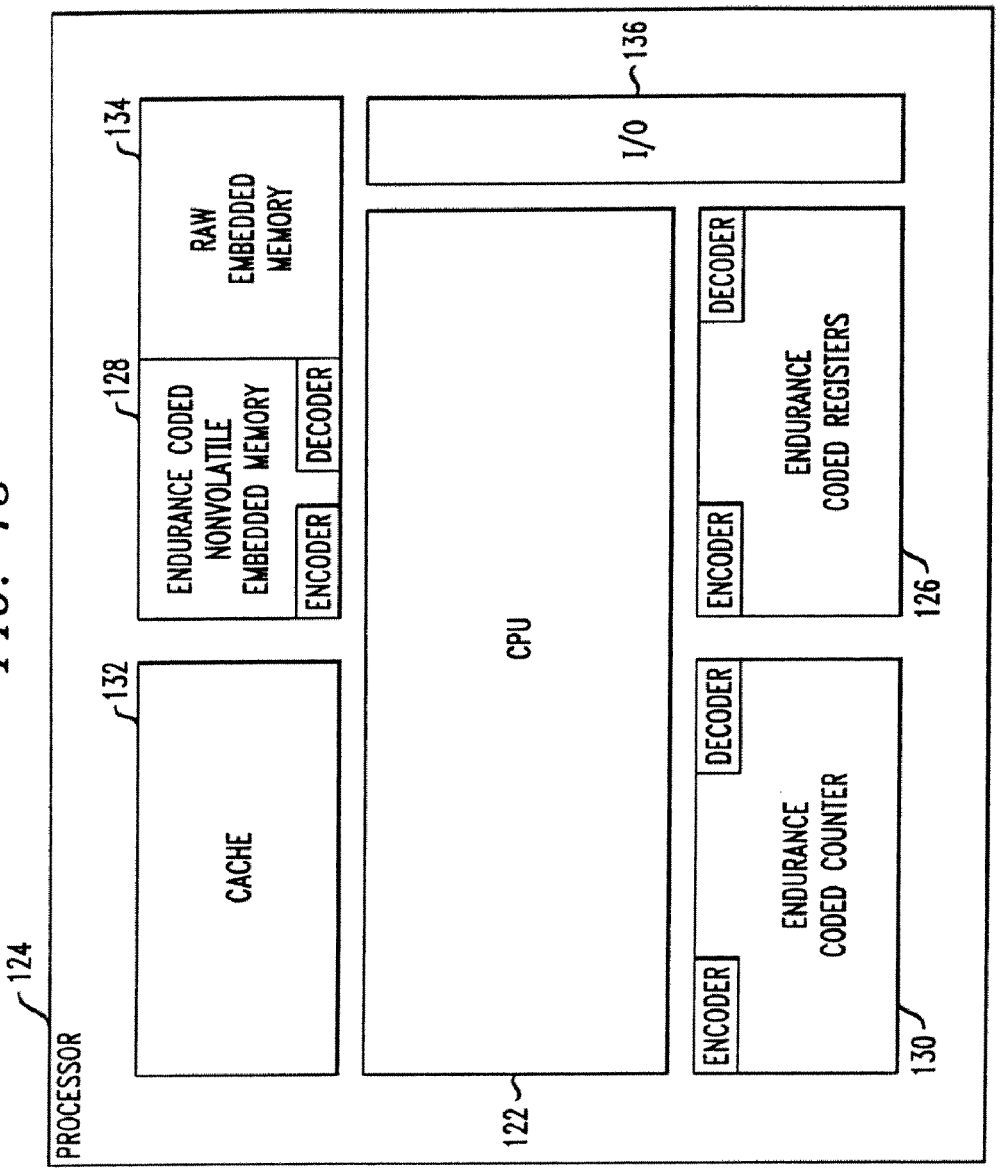
FIG. 13 shows an example of a processor with multiple components, some of which are memories which are endurance coded, according to yet a further aspect of the invention.

FIG. 13 depicts a processor 124 with multiple components. Some of these components are memories which are endurance coded; the illustration depicts registers 126 which are endurance coded, embedded memory 128 which is optionally endurance coded, and also an endurance coded counter 130. Also included are CPU 122, cache 132, "raw" embedded memory portion 134, and input/output block 136. Note the encoder and decoder for all three endurance coded regions 126, 128, 130 (not separately numbered).

Figure 15:
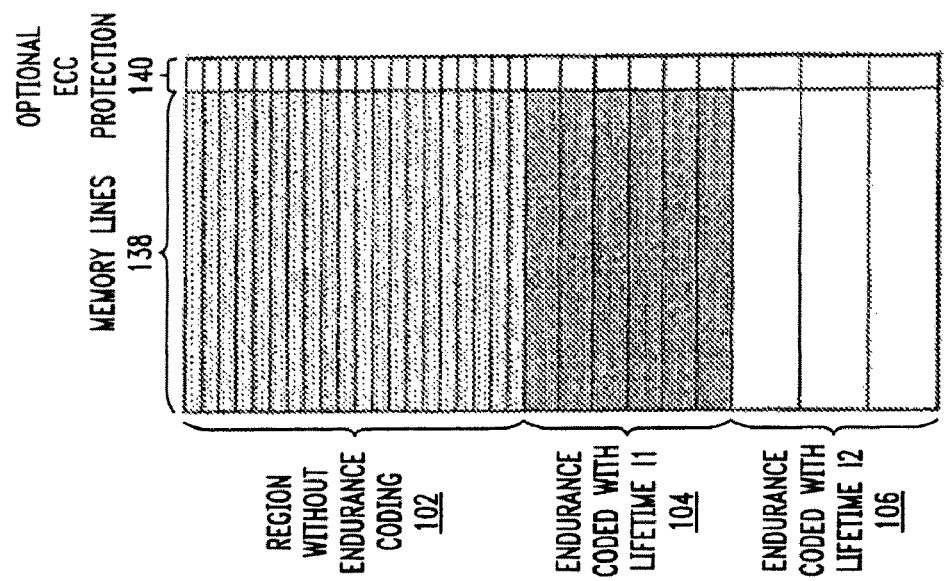
FIG. 15 depicts an exemplary structure of an endurance coded memory, according to an even further aspect of the invention.
Figure 14:
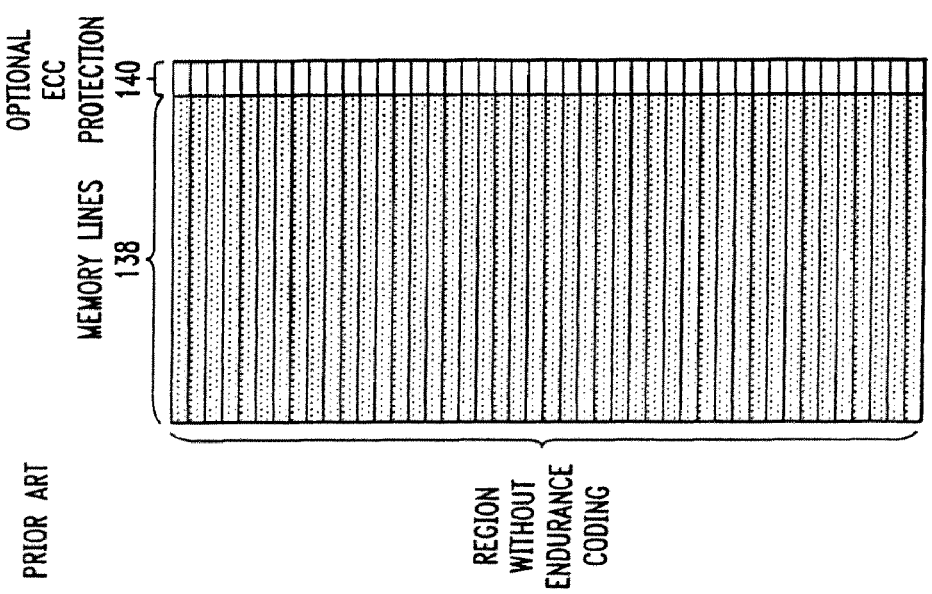
FIG. 14 depicts a standard memory structure, organized in lines of a given length, each with optional check bits for possible error correction coding, according to the prior art.

FIG. 14 shows a standard memory (or storage) structure, organized in lines 138 of a given length, each with optional check bits for possible error correction coding 140. FIG. 15 shows the structure of a corresponding endurance coded memory. In this particular embodiment, the memory is shown as a unit where different regions of the same address space are encoded differently, that, with endurance codes having different properties (for example, region 102 without coding, region 104 endurance coded with lifetime 11, and region 106 endurance coded with lifetime 12).

Figure 18:
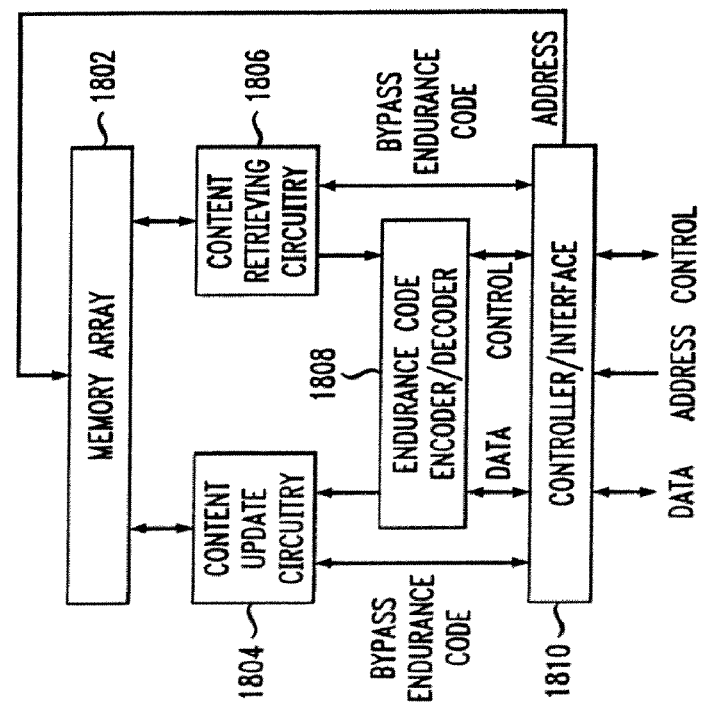

FIGS. 16-18 depict the basic operations of an exemplary unified memory controller. As in FIG. 16, to read the contents of a given line, receive the line address whose content is to be retrieved, as per step 1602. In step 1604, identify, based on the address and on a table accessible to the controller, the endurance code associated with the region and the actual physical memory range associated with the endurance coded line Instruct the endurance code encoder/decoder which coding scheme to use. As per step 1606, retrieve the contents of the memory line. In step 1608, decode the contents (this step can be performed by the endurance code encoder/decoder) and optionally perform error correction. As indicated in step 1610, output the retrieved data.

As in FIG. 17, to write contents into a given line address, receive the address where the contents are to be stored, as per step 1702. In step 1704, identify, based on the address and on a (nonvolatile) table accessible to the controller, the endurance code associated with the region and the actual physical memory range associated with the endurance coded line. Instruct the endurance code encoder/decoder which coding scheme to use. As per step 1706, retrieve the contents of the memory line. In step 1708, compute the update information based on the data to be stored and the current contents of the line. As indicated at step 1710, perform the update using the content update circuitry. Optionally, step 1712 of sending an acknowledge message, can be carried out.

Note in FIG. 18 memory array 1802, content update circuitry 1804, content retrieving circuitry 1806, endurance code encoder/decoder 1808, and controller interface 1810.

Figure 19:
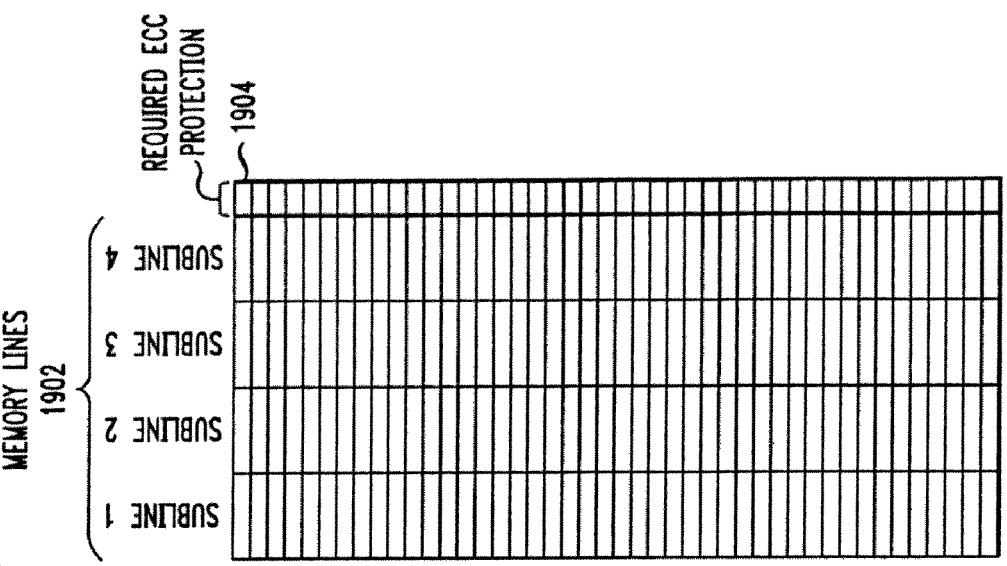
FIG. 19 shows a nonvolatile memory protected by error correcting codes, according to an approach not using endurance coding.

FIG. 19 shows a nonvolatile memory protected by error correcting codes, according to a system not using endurance coding. The memory is organized in lines 1902, each line is divided into sublines 1-4, and each line has a corresponding parity sequence 1904. The parity sequence associated with a line is computed as a function of the content of each subline, using a standard error correction code. The memory subsystem allows updating each subline individually, such that the remaining sublines may be left unchanged. Each update, however, requires re-computation of the parity sequence and updating of same. As a consequence, the parity sequence may be updated more often that the payload.

Figure 21:
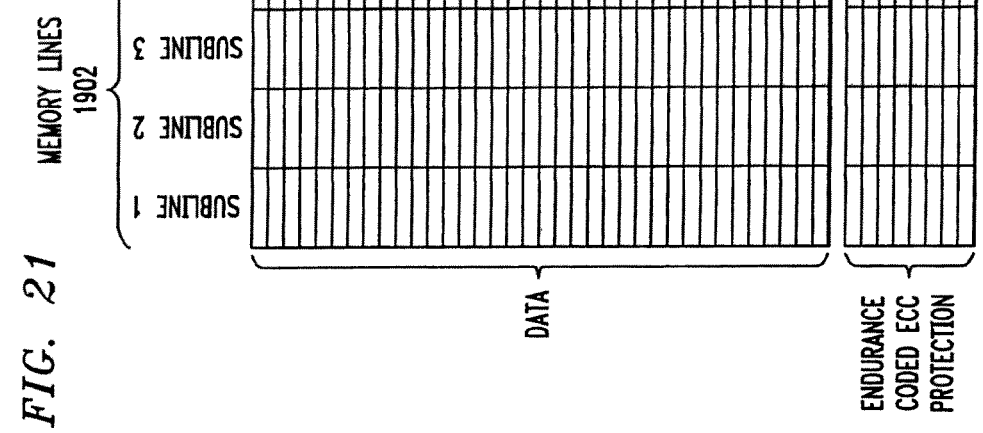
FIGS. 20 and 21 show exemplary features of a nonvolatile memory protected by error correcting codes, according to further additional aspects of the invention.
Figure 20:
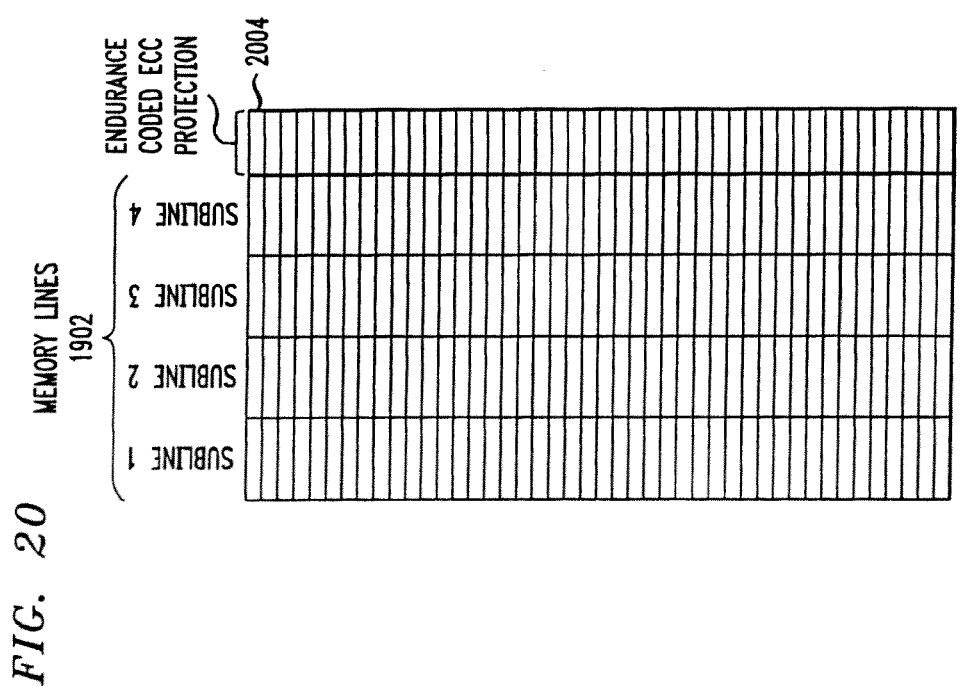
Figure 22:
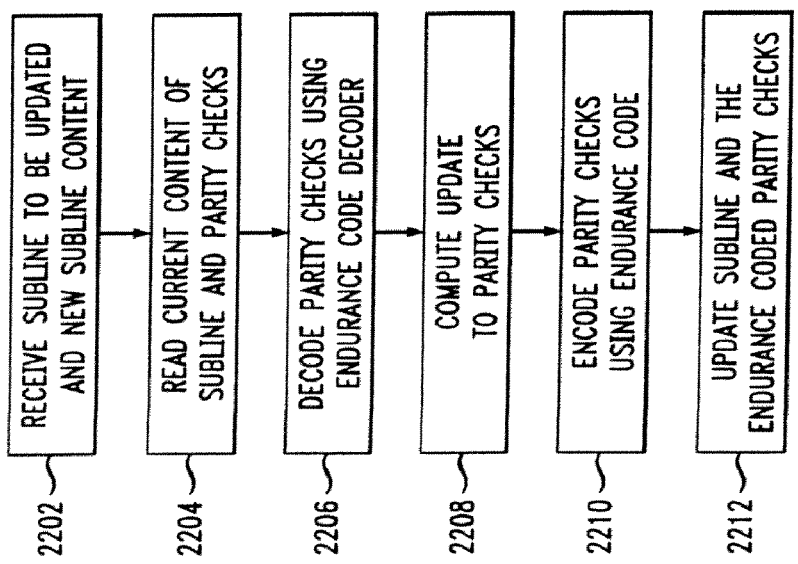

In FIGS. 20 and 21, according to an aspect of the invention, each parity sequence is encoded using an endurance code, as indicated at 2004. An exemplary procedure for carrying this out is described in FIGS. 22 and 23, where a flow chart (FIG. 22) describes exemplary steps for the operation of updating a subline. In step 2202, the desired updated content and the address specifying the subline to be updated are accepted. In step 2204, the content of the subline and the endurance encoded parity bits is retrieved (optionally all the line may be retrieved). As per step 2206, the parity bits are decoded using an endurance code decoder. In step 2208, the updated parity checks are computed. Step 2210 shows encoding the parity checks with the endurance encoder, while in step 2212, the subline and the parity checks are updated.

Typically, if the ECC code is a linear code, the only requirement is to retrieve the parity checks and the subline to be updated. Optionally, one may want to retrieve the entire line and the parity checks in order to verify the possible presence of errors in the line. Appropriate functionality may be obtained by structuring the memory as shown in FIGS. 20-21, where the payload is shown to be stored in a memory region and the parity sequence in a different memory region 2004 which is endurance encoded and therefore exhibits an extended lifetime.

Figure 23:
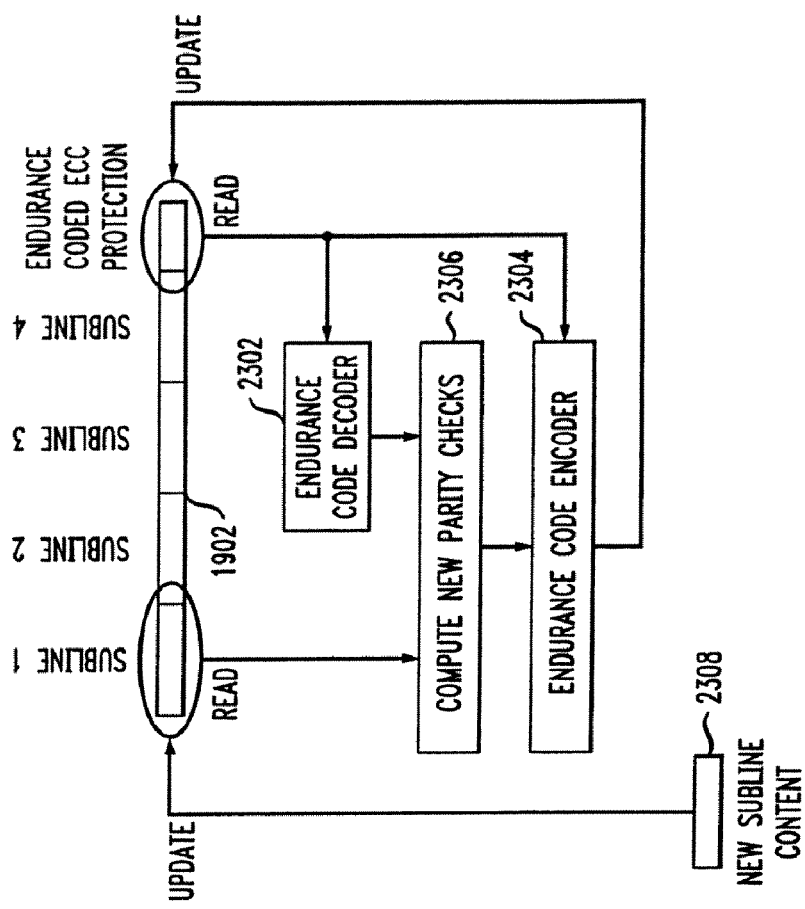
FIGS. 22 and 23 illustrate exemplary techniques for updating a subline, useful, for example, in connection with exemplary features of FIGS. 20 and 21, according to even further additional aspects of the invention.

FIG. 23 depicts an individual line 1902 with sublines 1-4 and endurance coded ECC protection 2004. Also shown are endurance code decoder 2302, endurance code encoder 2304, the computation of new parity checks in block 2306, and new subline content 2308.

Figure 25:
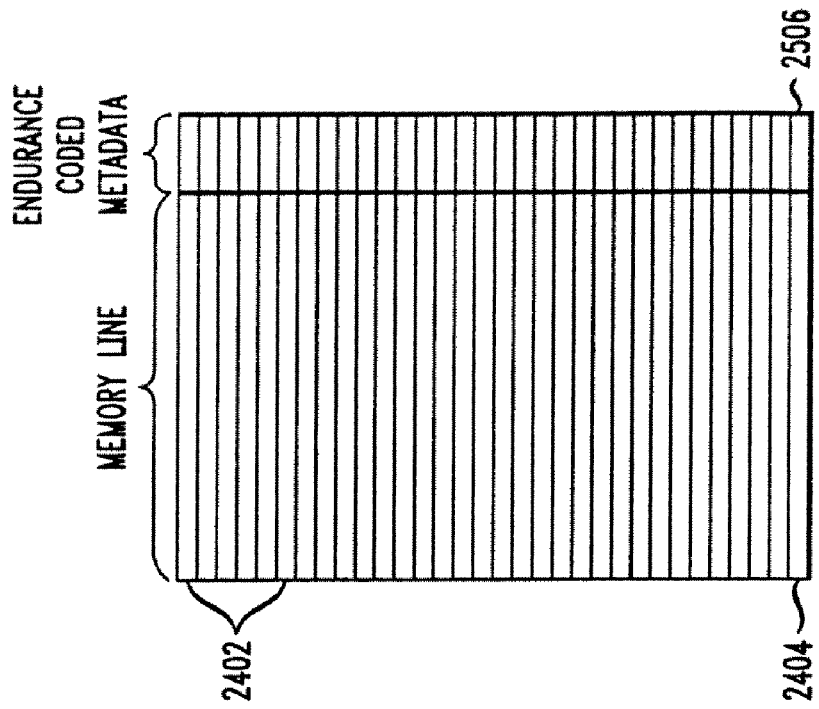
FIG. 25 shows a nonvolatile memory organized by lines and having endurance-coded metadata, according to a still further additional aspect of the invention.
Figure 24:
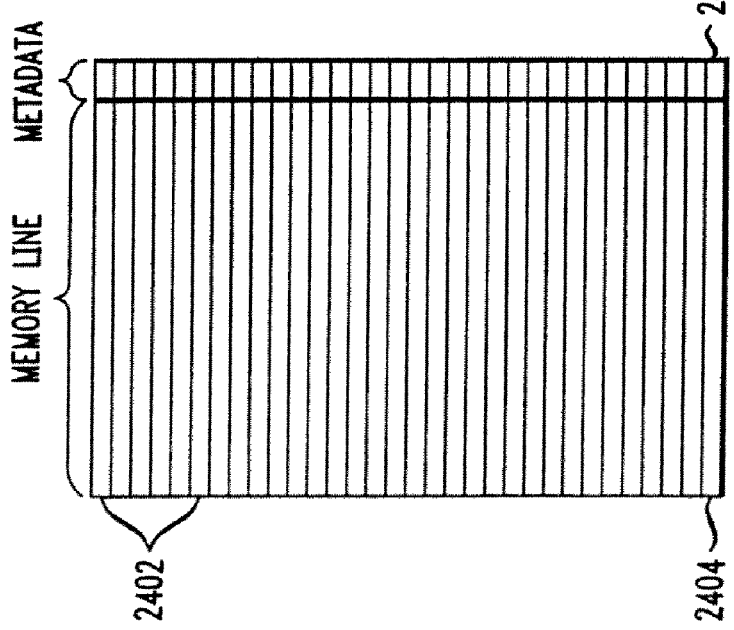
FIG. 24 shows a nonvolatile memory organized by lines and having metadata, according to the prior art.

In some particular memory and storage structures, some regions tend to be updated more often than others. For example, a memory system might want to keep track of information regarding the statistics of the access to individual memory lines. This type of metadata is typified by a more frequent update than the memory regions it refers to. FIG. 24 shows a prior art memory system organized in lines 2402, each divided into payload 2404 and metadata 2406. In one or more embodiments, this metadata can be stored in endurance encoded regions 2506 as shown in FIG. 25. This allows increasing the lifetime of these specific regions, enabling longer lifetime for the memory subsystem itself. The metadata might also be any data whose reliability is more important than the reliability of the corresponding memory that is not coded with an endurance code. As an example, the portions 2404 of each line in FIG. 25 may store information of a transaction whose crucial parts can be rebuilt by other sources, while the parts 2506 may store crucial information whose loss must be avoided. By guaranteeing that each of the memory elements in the regions 2506, once endurance encoded, is accessed a smaller number of times than it would be if uncoded, the reliability of that memory region is improved. It will be appreciated that in one sense, FIGS. 20 and 21 are a special case of FIG. 25, wherein the metadata is the ECC.

In FIG. 26, a similar concept as in FIG. 25 is applied to a storage system 2600 which provides at least two different regions, at least one of them 2604 being endurance encoded. In the example of FIG. 26, the other region 2602 is not endurance coded. The storage system is organized in a file system which exploits the presence of an endurance encoded region 2604, i.e., an extended lifetime region, to store quickly mutable data, such as metadata (for example file access time stamps), or portions of files that are identified as potentially frequently changing. Such a file system may leverage the possibility of dynamically specifying the position, size and type of endurance coding of memory blocks to the controller (omitted from FIGS. 26 and 27 for brevity), which is responsible for collecting and executing the commands received from the user (which will typically be a computing machine) and managing the encoding and decoding, both for error protection and endurance improvement, and interfacing with the physical medium. An example of the file system organization is shown in FIG. 27. Note blocks 2604 which are endurance coded with a first scheme, and blocks 2606 which are endurance coded with a second scheme. The remaining blocks 2602 are not endurance coded.

Thus, one or more embodiments of the invention provide a memory subsystem that provides access to one or more memory regions, based on a single memory technology. Such technology provides memory elements that can be reliably written a limited number of times. One or more memory regions provide "virtual" memory locations that can individually be written reliably a number of times greater than that provided by such technology. In some instances, the memory regions lay in the same address space. In some cases, the same technology is used to provide more than one address space.

A write efficient memory code can be used for improving the lifetime of a memory region. A write once memory code can be used for improving the lifetime of a memory region. The subsystem can be part of a storage system. The storage system can store frequently updated data in the memory region that has a lifetime longer than the lifetime provided by the underlying memory technology.

Given the discussion thus far, it will be appreciated that one aspect of the invention is directed to choosing the form of a message for storage in a PCM, so as to minimize damage. Thus, in general terms, an exemplary phase-change memory can include a matrix 1002 of storage cells (for example, cells exemplified by cells 1004 in FIG. 1). The matrix includes at least a first group, comprising at least one of the storage cells 1004. Each of the storage cells includes a phase change material such as 1006 having at least a first resistance value and a second resistance value, such that the first group can have an identical message encoded therein in at least a first way and a second way. The memory also includes a controller, such as controller 108, that is electrically coupled to the matrix 1002, and that is configured to encode the identical message in the at least first group using either the first or second way, based on which way causes the least amount of writing cost to the group when writing the encoded message into the group, given current levels of the group. The current levels of the group should be known in this approach, as this information is required to select the way to write the new data in order to pick the way with the lowest amount of writing cost. The phase-change memory optionally but preferably includes a decoder configured to recover the message from the levels in the at least first group.

Note that the controller can be in a package with the matrix or outside. The controller is preferably high speed hardware, but can also be a processor employing software in the form of microcode or firmware.

Note that, as used herein, a "transition" encompasses an increase or a decrease in a level in a cell.

By way of clarification, as noted above, the first group can have an identical message encoded therein in at least a first way and a second way. Cells that are only capable of two levels (two resistance values) are not capable of endurance coding unless the information is stored in two or more cells. Conversely, endurance coding can be applied to a single cell where the cell can have an identical message encoded therein in three or more ways (for example, three or more resistance levels). Similar comments apply to other embodiments using other than PCM, where multiple levels correspond to physical phenomena other than resistance of phase change material.

Furthermore, non-limiting examples of groups include, for memories organized in a row-column structure:
 all cells in the same row
 cells in a section of a row (a sub-set of the columns in a row)
 in the case of multiple memory arrays (e.g., chips) in physically separate places, all cells in the same row on each of the memories (e.g., row 5 on each separate memory chip)
 also in the case of multiple memory arrays (e.g., chips) in physically separate places, all cells in the same section of the same row on each of the memories (e.g., columns 2-4 in row 5 on each separate memory chip)

The above examples are non-limiting. For example, a group could include cells in two or more rows (but this aspect might be less common due to the need for two addresses in such case).

It should be noted that one of the reasons for using endurance coding, in at least some instances, is because the particular region of data that will be endurance coded will be written to more frequently. Nonetheless, there is a second reason which is also of interest in at least some cases, which is that the particular regions that are endurance coded might be very important and hence require more reliability than the rest of the data for example, the endurance coded regions might be needed to access the rest of the data (if damaged it would disallow access to the rest of the data). It is possible to attain more reliability by endurance coding because even if the endurance coded region is not subject to additional writing, the lower damage that is inflicted in the cells will cause possible errors to be delayed with respect to the rest of the memory.

Note also that in one or more embodiments of the invention, all cells do not necessarily degrade with use. In one or more embodiments, there is one kind of memory which does degrade with use, and which is accessed more frequently, where endurance coding is applied. The other section may not degrade at all (e.g. DRAM) or may degrade and yet will not be endurance coded, or may degrade and may have a different degree of endurance coding applied to it.

In some cases, the above-mentioned writing cost is the damage to the cell or cells being written to; furthermore, the phase change material undergoes greater damage from melting than from crystallization, and the controller chooses the first or second way by choosing crystallization in preference to melting.

In some instances, the above-mentioned writing cost is the energy cost for writing to a given cell or cells, and the controller chooses the first or second way by choosing a lower energy cost in preference to a higher energy cost.

In another aspect, an exemplary embodiment of a memory includes a matrix of storage cells, such as matrix 1002 of cells 1004. However, in this aspect, the cells may, but need not, be PCM cells. The matrix includes at least a first group, which in turn includes at least one of the storage cells. Each of the storage cells has at least two levels, such that each of the storage cells can have an identical message encoded therein in at least a first way and a second way. Each of the storage cells is arbitrarily individually changeable among the at least two levels, and each of the cells is asymmetric, such that increasing from a first level to a second level has a different cost than decreasing from the second level to the first level. The memory also includes a controller, such as 108, that is electrically coupled to the matrix, and that is configured to encode the identical message in the at least first group using the first way or the second way, based on which way incurs the least cost when writing the message into the at least one cell of the at least first group, given current levels of the at least first group.

Recalling FIGS. 3 and 4, and the above discussion of waterfall coding, in some cases, the at least first group has exactly one of the storage cells, the identical message is one of M messages to be encoded in the exactly one cell of the at least first group, and the exactly one cell can be programmed to have N of the levels. In this aspect, the identical message is encoded in the exactly one cell of the at least first group by changing the current cell level to a changed cell level, such that a remainder of division of the changed cell level by M is equal to the identical message. The changing of the current cell level to the changed cell level includes selecting the change to result in a least total cost.

In some cases, the waterfall codes can be used with a PCM, and the cost of increasing the variable resistance of the cell is higher than the cost of decreasing the variable resistance of the cell.

In some cases, N is a power of two, M=2, the messages comprise zero and one, and even levels correspond to zero or one and odd levels correspond to the complement (that is, one or zero). Refer back to FIG. 3 for an example.

In some cases, N is a power of two and M is another power of two, less than N. A binary representation of the message is obtained from a binary representation of the changed cell level by dropping y least significant bits from the binary representation of the changed cell level. Furthermore, $y = \log_2(N-M)$, and the messages include zero, one, two, and three. Refer back to FIG. 4 for a non-limiting example in which M=4 and N=8.

In one or more embodiments, the identical message is one of M messages to be encoded in the at least first group. The group includes $n_c$ given ones of the storage cells, and the encoding of the identical message is carried out per equation (22). New levels can be selected, for example, to minimize the cost of changing levels.

It should be noted that, in general, some of the new levels might in fact be equal to the current levels; however, at least one new level is different from its corresponding current level if the message to be encoded is different from the current message.

With reference to the above section on multi-cell codes, in some cases, the $v_i$ are consecutive integers, $n_c = M-1$, the cells can be programmed with a level selected from among N levels, and N is divisible by M.

With reference to the above section on hypercells, in some cases, the storage cells have N levels, groups of H of the storage cells are grouped together as hypercells, and given levels in the storage cells of a given one of the hypercells correspond to a hyperlevel in the given one of the hypercells. Preferably, the given levels of the storage cells in the given one of the hypercells are determined by a Gray code of the hyperlevel.

Recalling now FIGS. 9-13 and 15-18, in one or more embodiments, an exemplary memory system includes an assembly of memory with at least a first section and a second section. At least the memory cells in the first section are of a kind which degrade with use. The first section of the memory cells is encoded, according to a first endurance coding scheme, to reduce the degradation with use. The second section of the memory cells is not encoded according to the first endurance coding scheme. A controlling module is electrically coupled to the assembly, and is configured to write first data, requiring frequent writing and/or high reliability, to the first section, and to write second data, not requiring frequent writing and/or high reliability (i.e., as compared to the first section) to the second section.

As seen in FIGS. 9-11, the assembly of the memory cells could be a matrix 100, 110, 112 of the memory cells addressed as a single address space, and the controlling module could be controller 108. With particular reference to FIGS. 16-18, the controller can be configured to perform a READ operation by receiving an address to be read from, in block 1602; determining whether the address to be read from is associated with the first section or the second section, in block 1604; and retrieving content of a memory line associated with the address to be read from, as per block 1606. Responsive to determining that the address is associated with the first section, per block 1608, decode the content of the memory line associated with the address to be read from, according to the first endurance coding scheme, to obtain decoded data. The decoded data is output in block 1610.

Furthermore, the controller can be configured to perform a WRITE operation by receiving an address to be written to and corresponding data to be written, as in block 1702; determining whether the address to be written to is associated with the first section or the second section, as in block 1704, and, responsive to determining that the address to be written to is associated with the first section, retrieving content of a memory line associated with the address to be written to, as in block 1706. Note that current content needs to be retrieved when writing to an endurance coded region, so as to know the appropriate way to write the new data. As in block 1708, responsive to determining that the address to be written to is associated with the first section, the controller encodes the corresponding data to be written, according to the first endurance coding scheme, to obtain encoded data; and updates memory content at the address to be written to with the encoded data (of course, if the WRITE is to a non-encoded section, un-encoded data is written).

As seen in FIG. 9, in some cases, the second section 102 of memory cells is not endurance coded, and there is a third section of 106 endurance coded according to a second endurance coding scheme. The memory cells in the third section are of a kind which degrade with use. The controlling module (e.g., controller 108) is configured to write third data, requiring intermediately frequent writing and/or intermediate reliability, to the third section 106 according to the second endurance coding scheme. Note first section 104.

As seen in FIG. 10, in some cases, the second section 106 of the memory cells is endurance coded according to a second endurance coding scheme. Note first section 104.

As seen in FIG. 11, sometimes the sections are not configured as contiguous blocks.

With reference to FIG. 12, in some cases the first section of the memory cells 104 comprises a first memory 116 and the second section (102 or 106) of the memory cells comprises a second memory (114 or 118), and the controlling module includes a controller 108 of the first memory, a controller 108 of the second memory, and a unified memory interface 122 electrically coupled to the controller of the first memory and the controller of the second memory. The controller 108 of the first memory 116, in some cases, carries out the encoding according to the first endurance coding scheme. In other cases, the unified memory interface 122 carries out the encoding according to the first endurance coding scheme. In still other instances, the controlling module includes a controller 108 of the first section of the memory cells, a controller 108 of the second section of the memory cells, and a central processing unit (also represented by block 122 and shown explicitly in FIG. 3, where the CPU, memory cells and controllers are packaged together) electrically coupled to the controller of the first section of the memory cells and the controller of the second section of the memory cells. Thus, for the avoidance of doubt, examples of a controlling module are:

memory controllers 108 plus block 122 in the guise of a unified memory interface memory controllers 108 plus block 122 in the guise of a CPU.

Furthermore, as discussed, endurance coding could be carried out in block 122 or at the individual controllers 108.

With reference to FIG. 25, in some cases, an exemplary memory system includes a matrix of memory cells organized as a plurality of memory lines 2402. Each of the lines includes a payload portion 2404 and a metadata portion 2506. The metadata portions require more frequent update and/or higher reliability than the payload portions. At least the cells associated with the metadata portions are of a kind which degrade with use. The memory cells associated with the metadata portions 2506 are encoded according to a first endurance coding scheme, to reduce the degradation with the use and thereby achieve the requirements. Those of the memory cells associated with the payload portions 2404 are not encoded according to the first endurance coding scheme. A controller is electrically coupled to the matrix (not shown explicitly in FIG. 25). In the special case of FIGS. 20-23 the metadata portions are error correcting code portions 2004 and the memory lines 1902 are subdivided into sub-lines 1-4. The controller (see FIG. 23) is configured to carry out method steps shown in FIG. 22, namely, to receive a given one of the sub-lines to be updated, and a new content therefore, as per block 2202; read a current content of the given sub-line and associated parity checks, as per block 2204; and decode the parity checks according to the first endurance coding scheme, as per block 2206. Furthermore, the controller computes an update to the parity checks, as per step 2208; encodes the updated parity checks according to the first endurance coding scheme, as at 2210; and writes updated content into the given one of the sub-lines to be updated and writes the updated parity checks into an associated error correcting code portion, as in block 2212.

As shown in FIGS. 26 and 27, an exemplary file system includes an assembly 2600 of memory blocks comprising a first region 2604 and a second region 2602. The memory blocks are of a kind which degrade with use. The first region 2604 of the memory blocks is encoded, according to a first endurance coding scheme, to reduce the degradation with the use. The second region 2602 of the memory blocks is not encoded according to the first endurance coding scheme. The first region 2604 has quickly mutable data and/or data requiring high reliability, stored therein (as compared to the second region 2602). A controller (not explicitly shown) is electrically coupled to the assembly 2600, and the controller interface between the assembly and an external user and dynamically reconfigures the blocks among the regions, as shown in FIG. 27.

Figure 30:
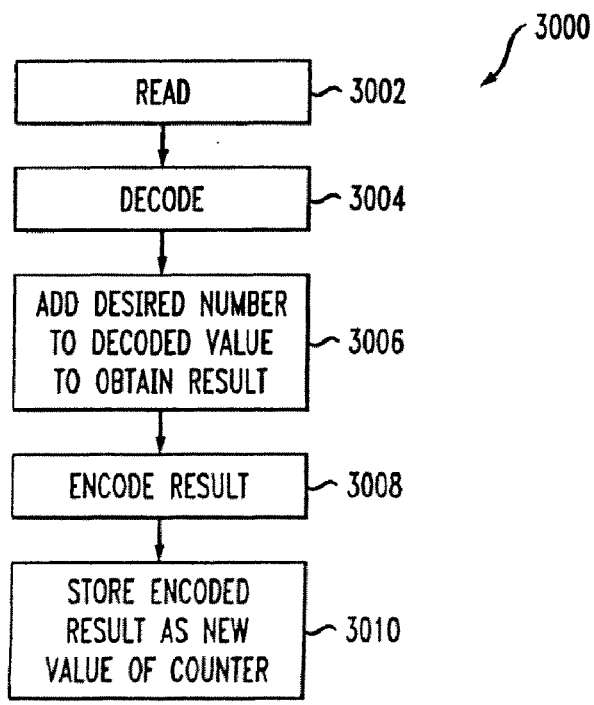
FIG. 30 depicts a flow chart of exemplary method steps.

With reference to FIG. 30, in a still further aspect, an exemplary method 3000 includes reading current contents of a counter, stored in a non-volatile memory, as at 3002. The counter is endurance coded according to an endurance code. Further steps include 3004, decoding the current contents using the endurance decoder to obtain a decoded current contents value; and 3006, adding a desired number, having one of a positive and a negative number value, to the decoded current contents value, to obtain a result. The result can then be encoded in 3008, using the endurance code, to obtain an encoded result; and the encoded result can be stored in the nonvolatile memory as the new value of the counter, in 3010. The foregoing describes adding to the current value. When it is merely desired to read the counter value, the first steps 3002 and 3004 can be performed. The method can be carried out, for example, using any of the exemplary systems disclosed herein, under control, for example, of a block 108, 122, combinations thereof, and the like.

Design Structure Aspects

Figure 28:
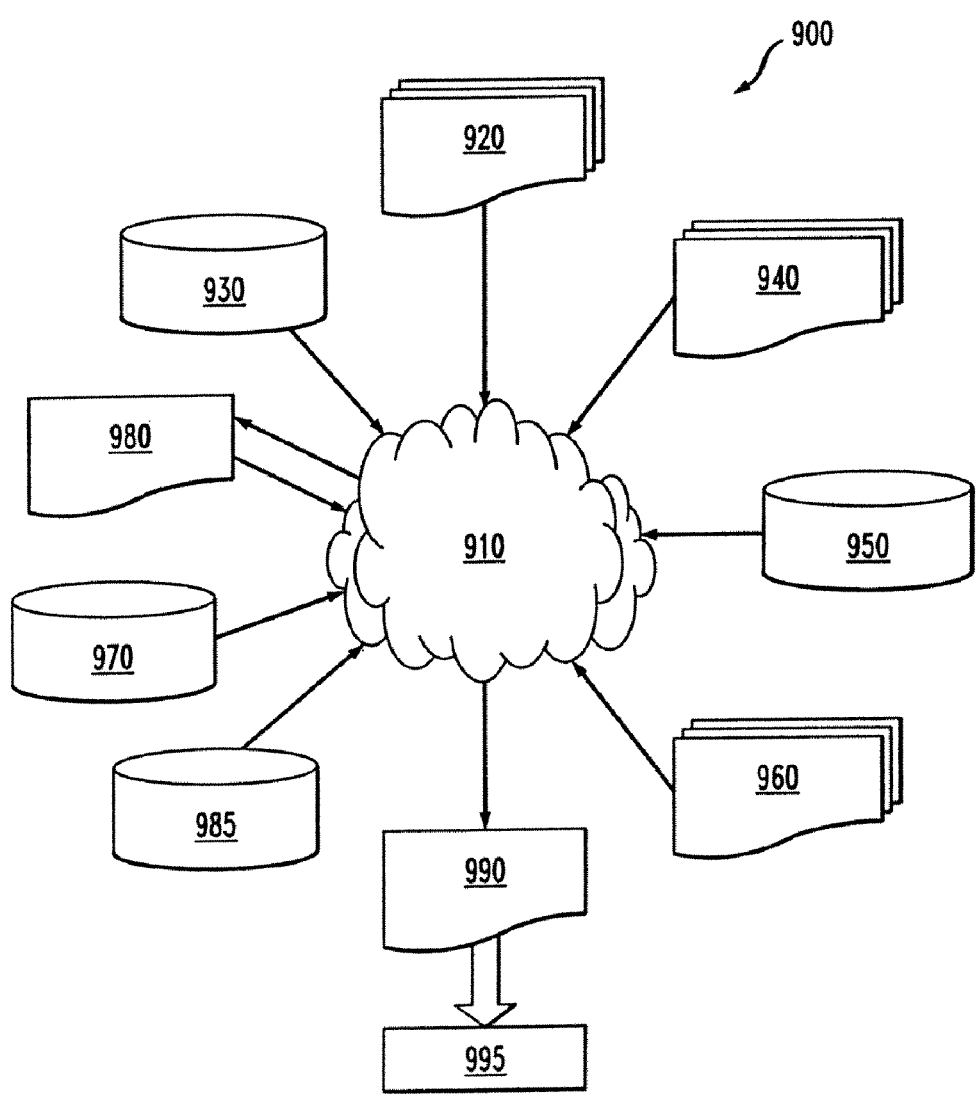
FIG. 28 is a flow diagram of a design process used in semiconductor design, manufacture, and/or test.

FIG. 28 shows a block diagram of an exemplary design flow 900 used for example, in semiconductor integrated circuit (IC) logic design, simulation, test, layout, and manufacture. Design flow 900 includes processes and mechanisms for processing design structures or devices to generate logically or otherwise functionally equivalent representations of the design structures and/or devices described above and shown in FIGS. 1, 9-13, 15-18, 20-23, and 25-27. The design structures processed and/or generated by design flow 900 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 9-13, 15-18, 20-23, and 25-27. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 9-13, 15-18, 20-23, and 25-27 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 9-13, 15-18, 20-23, and 25-27. In one embodiment, design structure 990 may comprise a compiled, executable HDL simulation model that functionally simulates the devices shown in FIGS. 1, 9-13, 15-18, 20-23, and 25-27.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 9-13, 15-18, 20-23, and 25-27. Design structure 990 may then proceed to a stage 995 where, for example, design structure 990: proceeds to tape-out, is released to manufacturing, is released to a mask house, is sent to another design house, is sent back to the customer, etc.

Exemplary System and Article of Manufacture Details

A variety of techniques, utilizing dedicated hardware, general purpose processors, firmware, software, or a combination of the foregoing may be employed to carry out the design process just described, or to implement components of the invention such as 108, 122, and the like. Some instances can employ a computer product including a computer usable medium with computer usable program code for performing steps, and/or an apparatus including a memory and at least one processor that is coupled to the memory and operative to perform steps.

Figure 29:
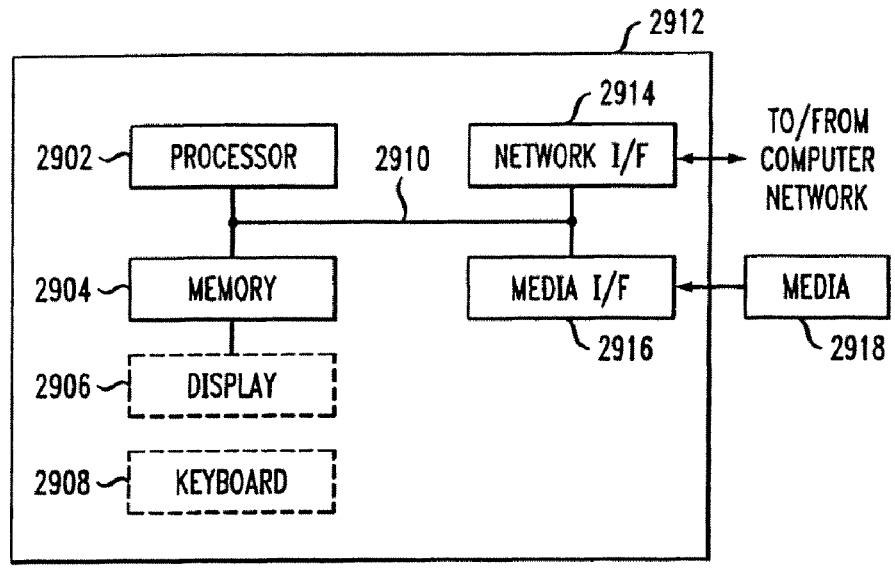
FIG. 29 depicts a computer system that may be useful in implementing one or more aspects and/or elements of the invention.

The design process, for example, can make use of software running on a general purpose computer or workstation. With reference to FIG. 29, such an implementation might employ, for example, a processor 2902, a memory 2904, and an input/output interface formed, for example, by a display 2906 and a keyboard 2908. The term "processor" as used herein is intended to include any processing device, such as, for example, one that includes a CPU (central processing unit) and/or other forms of processing circuitry. Further, the term "processor" may refer to more than one individual processor. In the general body of the application, "memory" refers to one or more indicated embodiments. In the context of this discussion of a general purpose computer, the term "memory" can include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 2902, memory 2904, and input/output interface such as display 2906 and keyboard 2908 can be interconnected, for example, via bus 2910 as part of a data processing unit 2912. Suitable interconnections, for example via bus 2910, can also be provided to a network interface 2914, such as a network card, which can be provided to interface with a computer network, and to a media interface 2916, such as a diskette or CD-ROM drive, which can be provided to interface with media 2918.

Accordingly, computer software including instructions or code for performing the design process, as described herein, may be stored in one or more of the associated memory devices (for example, ROM, fixed or removable memory) and, when ready to be utilized, loaded in part or in whole (for example, into RAM) and executed by a CPU. Such software could include, but is not limited to, firmware, resident software, microcode, and the like. Furthermore, while a hardware implementation of elements 108, 122, and the like is preferred, in some instances, such elements can be implemented in software such as firmware or microcode.

Aspects of the design process, or elements such as 108, 122, can take the form of a computer program product accessible from a computer-usable or computer-readable medium (for example, media 2918) providing program code for use by or in connection with a computer or any instruction execution system. For the purposes of this description, a computer usable or computer readable medium can be any apparatus for use by or in connection with the instruction execution system, apparatus, or device. The medium can store program code to execute one or more steps.

The medium can be an electronic, magnetic, optical, electromagnetic, infrared, or semiconductor system (or apparatus or device) or a propagation medium. Examples of a tangible computer-readable recordable storage medium include a semiconductor or solid-state memory (for example memory 2904), magnetic tape, a removable computer diskette (for example media 2918), a random access memory (RAM), a read-only memory (ROM), a rigid magnetic disk and an optical disk (but exclude a propagation medium). Current examples of optical disks include compact disk-read only memory (CD-ROM), compact disk-read/write (CD-R/W) and DVD.

A data processing system suitable for storing and/or executing program code will include at least one processor 2902 coupled directly or indirectly to memory elements 2904 through a system bus 2910. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards 2908, displays 2906, pointing devices, and the like) can be coupled to the system either directly (such as via bus 2910) or through intervening I/O controllers (omitted for clarity).

Network adapters such as network interface 2914 may also be coupled to the system to enable the data processing system to become coupled to other data processing systems or remote printers or storage devices through intervening private or public networks. Modems, cable modem and Ethernet cards are just a few of the currently available types of network adapters.

As used herein a "server" includes a physical data processing system (for example, system 2912 as shown in FIG. 29) running a server program. It will be understood that such a physical server may or may not include a display and keyboard.

Computer program code for carrying out pertinent operations of the present invention (for example, the design process) may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). Again, for clarity, a hardware implementation of elements 108, 122, and the like is preferred, though in some instances, such elements can be implemented in software such as firmware or microcode.

Aspects of the invention have been described herein with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a tangible computer-readable recordable storage medium that can direct a computer or other programmable data processing apparatus to function in a particular manner, such that the instructions stored in the computer-readable medium produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various aspects of the present invention (or a design process therefor). In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, it should be noted that methods described herein may, as appropriate, include an additional step of providing a system comprising distinct software modules embodied on a tangible computer readable recordable storage medium. Appropriate method steps can then be carried out using the distinct software modules and/or sub-modules of the system, executing on a hardware processor. Further, a computer program product can include a tangible computer-readable recordable storage medium with code adapted to be executed to carry out one or more steps, including the provision of the system with the distinct software modules.

In any case, it should be understood that the processing capability described herein, such as in blocks 108, 122, may be implemented in various forms of hardware, software running on hardware, or combinations thereof; for example, application specific integrated circuit(s) (ASICS), functional circuitry, one or more appropriately programmed processors with associated memory, and the like. Given the teachings of the invention provided herein, one of ordinary skill in the related art will be able to contemplate other implementations of the components of the invention.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A memory system comprising:
    an assembly of memory cells comprising at least a first section and a second section, at least said memory cells in said first section being of a kind which degrade with use, said first section of said memory cells being encoded, according to a first endurance coding scheme increasing a number of said memory cells required to store a message, to reduce said degradation with said use, said second section of said memory cells not being encoded according to said first endurance coding scheme; and
    a controlling module electrically coupled to said assembly, said controlling module being configured to:
        write first data, requiring at least one of frequent writing and high reliability, to said first section; and
        write second data, not requiring said at least one of frequent writing and high reliability, to said second section.

2. The memory system of claim 1, wherein said assembly of said memory cells comprises a matrix of said memory cells addressed as a single address space, and wherein said controlling module comprises a controller.

3. The memory system of claim 2, wherein:
    said controller is configured to perform a READ operation by:
        receiving an address to be read from;
        determining whether said address to be read from is associated with said first section or said second section;
        retrieving content of a memory line associated with said address to be read from;
        responsive to determining that said address is associated with said first section, decoding said content of said memory line associated with said address to be read from, according to said first endurance coding scheme, to obtain decoded data; and outputting said decoded data; and
    said controller is configured to perform a WRITE operation by:
        receiving an address to be written to and corresponding data to be written;
        determine whether said address to be written to is associated with said first section or said second section;
        responsive to determining that said address to be written to is associated with said first section, retrieving content of a memory line associated with said address to be written to;
        responsive to determining that said address to be written to is associated with said first section, encoding said corresponding data to be written, according to said first endurance coding scheme, to obtain encoded data; and
        responsive to determining that said address to be written to is associated with said first section, updating memory content at said address to be written to with said encoded data.

4. The memory system of claim 2, wherein said second section of said memory cells is not endurance coded, further comprising a third section of said memory cells endurance coded according to a second endurance coding scheme, said memory cells in said third section being of a kind which degrade with use, and wherein said controlling module is configured to write third data, requiring one of intermediately frequent writing and intermediate reliability, to said third section according to said second endurance coding scheme.

5. The memory system of claim 2, wherein said second section of said memory cells is endurance coded according to a second endurance coding scheme.

6. The memory system of claim 2, wherein:
    all of said cells are of said kind which degrade with use;
    said matrix of memory cells is organized as an assembly of memory blocks;
    said first section has at least one of quickly mutable data, and data requiring high reliability, stored therein as compared to said second section; and
    said controller is configured to interface between said assembly and an external user and to dynamically reconfigure said blocks among said sections.

7. The memory system of claim 1, wherein said first section of said memory cells comprises a first memory and said second section of said memory cells comprises a second memory, and wherein said controlling module comprises:
    a controller of said first memory;
    a controller of said second memory; and
    a unified memory interface electrically coupled to said controller of said first memory and said controller of said second memory;
    wherein said controller of said first memory carries out said encoding according to said first endurance coding scheme.

8. The memory system of claim 1, wherein said first section of said memory cells comprises a first memory and said second section of said memory cells comprises a second memory, and wherein said controlling module comprises:
    a controller of said first memory;
    a controller of said second memory; and
    a unified memory interface electrically coupled to said controller of said first memory and said controller of said second memory;
    wherein said unified memory interface carries out said encoding according to said first endurance coding scheme.

9. The memory system of claim 3, wherein said controlling module comprises:
    a controller of said first section of said memory cells;
    a controller of said second section of said memory cells; and
    a central processing unit electrically coupled to said controller of said first section of said memory cells and said controller of said second section of said memory cells.

10. A memory system comprising:
    a matrix of memory cells organized as a plurality of memory lines, each of said lines comprising a payload portion and a metadata portion, said metadata portion requiring at least one of more frequent update and higher reliability than said payload portion, wherein:
        at least those of said memory cells associated with said metadata portions are of a kind which degrade with use;

said memory cells associated with said metadata portions are encoded according to a first endurance coding scheme increasing a number of said memory cells required to store a message, to reduce said degradation with said use and thereby achieve said requirement of at least one of more frequent update and higher reliability; and those of said memory cells associated with said payload portions are not encoded according to said first endurance coding scheme; and a controller electrically coupled to said matrix.

11. The memory system of claim 10, wherein said metadata portions comprise error correcting code portions and wherein said memory lines are subdivided into sub-lines, and wherein said controller is configured to:

receive a given one of said sub-lines to be updated, and a new content therefor;

read a current content of said given sub-line and associated parity checks;

decode said parity checks according to said first endurance coding scheme;

compute an update to said parity checks;

encode said updated parity checks according to said first endurance coding scheme; and write updated content into said given one of said sub-lines to be updated and write said updated parity checks into an associated error correcting code portion.

12. A method comprising the steps of:

reading current contents of a counter, stored in a nonvolatile memory, said counter being endurance coded according to an endurance code;

decoding said current contents using said endurance decoder to obtain a decoded current contents value;

adding a desired number, having one of a positive and a negative number value, to said decoded current contents value, to obtain a result;

encoding said result, using said endurance code, to obtain an encoded result; and storing said encoded result, as a new value of said counter, in said nonvolatile memory.

* * * * *